(12) United States Patent
Fan et al.

(10) Patent No.: US 6,773,859 B2
(45) Date of Patent: Aug. 10, 2004

(54) PROCESS FOR MAKING A FLEXOGRAPHIC PRINTING PLATE AND A PHOTOSENSITIVE ELEMENT FOR USE IN THE PROCESS

(75) Inventors: Roxy Ni Fan, Warren, NJ (US); Mark A. Hackler, Ocean, NJ (US); Anandkumar R. Kannurpatti, E. Windsor, NJ (US); Adrian Lungu, Old Bridge, NJ (US); Bradley K. Taylor, West Chester, PA (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 21 days.

(21) Appl. No.: 10/085,262

(22) Filed: Feb. 27, 2002

(65) Prior Publication Data

US 2003/0180655 A1 Sep. 25, 2003

(51) Int. Cl.⁷ .............................. G03F 7/34; G03F 7/095; G03F 7/11
(52) U.S. Cl. .................... 430/200; 430/254; 430/273.1; 430/306; 430/309; 430/327; 430/330
(58) Field of Search ................................. 430/200, 254, 430/273.1, 306, 309, 327, 330

(56) References Cited

U.S. PATENT DOCUMENTS

| | | |
|---|---|---|
| 3,060,024 A | 10/1962 | Burg et al. |
| 3,060,025 A | 10/1962 | Burg et al. |
| 3,264,103 A | 8/1966 | Cohen et al. |
| 4,429,027 A | 1/1984 | Chambers, Jr. et al. |
| 5,175,072 A | 12/1992 | Martens |
| 5,262,275 A | 11/1993 | Fan |
| 5,607,814 A | 3/1997 | Fan et al. |
| 5,719,009 A | 2/1998 | Fan |
| 5,840,463 A | 11/1998 | Blanchet-Fincher |
| 5,888,697 A | 3/1999 | Fan |
| 2002/0009672 A1 | 1/2002 | Daems et al. |

FOREIGN PATENT DOCUMENTS

| | | |
|---|---|---|
| EP | 0665469 A2 | 8/1995 |
| EP | 0665471 A2 | 8/1995 |
| EP | 0741330 A1 | 11/1996 |

Primary Examiner—Richard L. Schilling
(74) Attorney, Agent, or Firm—Thomas H. Magee

(57) ABSTRACT

The invention relates to a process for preparing a flexographic printing plate from a photosensitive element having a photopolymerizable layer and a thermally removable layer on the photopolymerizable layer. The process includes imagewise exposing the photosensitive element and thermally treating the exposed element to form a relief suitable for use in flexographic printing. The thermally removable layer can be transparent or opaque to actinic radiation. The invention also relates to a photosensitive element for use in this process. The photosensitive element includes a photopolymerizable layer and at least one thermally removable layer having a filler and a binder, wherein the binder is less than 49% by weight, based on the total weight of the binder and filler.

54 Claims, No Drawings

PROCESS FOR MAKING A FLEXOGRAPHIC PRINTING PLATE AND A PHOTOSENSITIVE ELEMENT FOR USE IN THE PROCESS

BACKGROUND OF THE INVENTION

1. Field of the Invention

This invention relates to a process for making a flexographic printing plate. In particular, the process forms the plate using a photosensitive element having at least one thermally-removable layer on at least one photopolymerizable layer and heating the element to form a relief surface suitable for flexographic printing. The invention also relates to a photosensitive element having a thermally-removable layer, which after undergoing thermally processing, is suitable for use as a flexographic printing plate.

2. Description of Related Art

Flexographic printing plates are widely used for printing of packaging materials ranging from corrugated carton boxes to card boxes and to continuous web of plastic films. Flexographic printing plates can be prepared from photopolymerizable compositions, such as those described in U.S. Pat. Nos. 4,323,637 and 4,427,759. The photopolymerizable compositions generally comprise an elastomeric binder, at least one monomer and a photoinitiator. Photosensitive elements generally have a layer of the photopolymerizable composition interposed between a support and a coversheet or a multilayer cover element. Flexographic printing plates are characterized by their ability to crosslink or cure upon exposure to actinic radiation. Typically the plate is uniformly exposed through the backside of the plate to a specified amount of actinic radiation. Next, an imagewise exposure of the front-side of the plate is made through an image-bearing artwork or a template, such as a photographic negative or transparency (e.g. silver halide film) inside a vacuum frame to ensure intimate contact of the artwork to the plate surface. The plate is exposed to actinic radiation, such as an ultraviolet (UV) or black light. The actinic radiation enters the photosensitive material through the clear areas of the transparency and is blocked from entering the black or opaque areas. The exposed material crosslinks and becomes insoluble to solvents used during image development. The unexposed, uncrosslinked photopolymer areas under the opaque regions of the transparency remain soluble and are washed away with a suitable solvent leaving a relief image suitable for printing. Then the plate is dried. The printing plate can be further treated to remove surface tackiness. After all desired processing steps, the plate is mounted on a cylinder and used for printing.

However, developing systems that treat the element with a solution are time consuming since drying for extended period (0.5 to 24 hours) is necessary to remove entrained developer solution. In addition, these developing systems produce potentially toxic by-product wastes (both the solvent and any material carried off by the solvent) during the development process.

To avoid the problems with solution development, a "dry" thermal development process may be used. In a thermal development process, the photosensitive layer, which has been imagewise exposed to actinic radiation, is contacted with an absorbent material at a temperature sufficient to cause the composition in the unexposed portions of the photosensitive layer to soften or melt and flow into an absorbent material. See U.S. Pat. Nos. 3,264,103 (Cohen et al.); U.S. Pat. No. 5,015,556 (Martens); U.S. Pat. No. 5,175,072 (Martens); U.S. Pat. No. 5,215,859 (Martens); and U.S. Pat. No. 5,279,697 (Peterson et al.). In all these cited patents imagewise exposure is conducted with a silver halide film target in a vacuum frame. The exposed portions of the photosensitive layer remain hard, that is, do not soften or melt, at the softening temperature for the unexposed portions. The absorbent material collects the softened un-irradiated material and then is separated and/or removed from the photosensitive layer. The cycle of heating and contacting the photosensitive layer may need to be repeated several times in order to sufficiently remove the flowable composition from the un-irradiated areas and form a relief structure suitable for printing. Thus remains a raised relief structure of irradiated, hardened composition that represents the desired printing image.

The photosensitive element for flexographic use typically includes one or more additional layers on the photopolymerizable layer on the side opposite the support, that is, sandwiched between the photopolymerizable layer and the coversheet. The one or more additional layers can be, for instance, a release layer for ease in removing the image-bearing transparency (mask film) after exposure under vacuum, an elastomeric capping layer, or a radiation opaque layer. The radiation opaque layer is used to form a mask in situ on or above the photopolymerizable layer. Since the radiation opaque layer typically is also sensitive to infrared-radiation, the radiation opaque layer is exposed imagewise to infrared laser radiation to form an image on the photopolymerizable layer, i.e., the in situ mask. The infrared laser radiation can selectively remove or ablate the infrared sensitive layer (i.e., radiation opaque layer) from the photosensitive element, as disclosed by Fan in U.S. Pat. Nos. 5,262,275 and 5,719,009; Fan in EP 0 741 330 A; and Van Zoeren in U.S. Pat. No. 5,506,086; or can selectively transfer the infrared sensitive material onto the photopolymerizable layer of the element as disclosed by Fan et al. in U.S. Pat. No. 5,607,814; and Blanchett in U.S. Pat. Nos. 5,766,819; 5,840,463; and EP 0 891 877 A. One or more barrier layers may also be present between the photopolymerizable layer and the radiation opaque layer to maintain the integrity of the radiation opaque layer on the photopolymerizable layer. Thereafter, the element is overall exposed with actinic radiation through the mask and then wet processed, that is, in a solvent or aqueous solution, to form the relief as described above.

U.S. Pat. No. 5,888,697 discloses a photosensitive element having an overall layer of powder material on a photopolymerizable layer. The layer of particulate material can be opaque or transparent depending on desired use. A transparent powder layer can function as a release layer for the photosensitive element. The opaque powder layer can function as the radiation opaque layer for the photosensitive element as explained above. The powder material can be organic, inorganic, mixtures of organic and inorganic compounds, or multicomponent. The particle size of the powder material is less than 50 microns. After imagewise exposure, the relief is formed in the photosensitive element by washing with a suitable developer selected from organic solutions, water, aqueous, or semi-aqueous solutions. Thus, only conventional wet processing to form the relief image was disclosed.

EP 0 665 471 A2 discloses thermally developable flexographic printing plates having a release layer on a photosensitive elastomeric layer. The release layer is composed of a cellulose-based polymer, such as hydroxyalkyl cellulose, which has a softening point and melt viscosity compatible with the softening temperature of the photosensitive elastomeric layer forming the relief layer. The preferred developing temperatures range from 95° C. to about 150° C. The cellulose-based polymer of the release layer has a softening temperature less than about 130° C. However, not all hydroxyalkyl cellulose compounds were appropriate as the release layer for thermally developed plates. Hydroxyalkyl cellulose having too high a molecular weight was too viscous at the desired thermal developing temperatures. EP 0 665 471 A2 also discloses that a layer of polyvinyl alcohol on a photosensitive elastomeric layer does not melt sufficiently for thermal development.

U.S. Pat. No. 3,060,024 discloses a photopolymerization process for reproducing images using a thermoplastic element composed of a thermoplastic organic polymer, an ethylenically unsaturated compound with a terminal ethylenic group and a photoinitiator. In the process, the thermoplastic element is exposed imagewise to actinic light through a target in a vacuum frame, heated to the tack temperature, and dusted with finely-divided solid particles of material. The particles remain in the unexposed image areas that become tacky during the heating step, and are removed from the exposed image areas that are non-tacky after cooling to room temperature. Then the dusted surface of the thermoplastic element is contacted to a separate image-receptive element at a transfer temperature of at least 40° C. Transfer temperatures is the temperature at which the image areas stick or adhere within 10 seconds under slight pressure to a filter paper, and is between 40 and 170° C. The thermoplastic element is separated from the separate element so that the particles and an adherent portion of the unexposed image areas transfer to the surface of the image-receptive element. The process of heating, dusting, contacting and heating can be repeated multiple times to provide copies of the image. Example XII discloses using carbon having a particle size of 73 micrometers on the thermoplastic element. The unexposed areas of the photopolymerized layer with the toned particle material transferred to a paper support to form a black relief image, 3 mils in thickness. The transferred relief was post-exposed for use in relief printing.

U.S. Pat. No. 3,060,025 discloses a process similar to that of U.S. Pat. No. 3,060,024, except that the particles can be coated on a separate surface and transferred upon contact to the unexposed areas (but not the exposed areas) of the thermoplastic element upon application of heat. Binders may be used to adhere the coated particle layer to a support surface. For both U.S. Pat. No. 3,060,024 and 3,060,025, the thermoplastic element is imagewise exposed prior to contacting with particles or a particle layer. Thus, the particle layer is not present during the imagewise exposure to actinic light.

U.S. Pat. No. 3,264,103 discloses photopolymeizable relief printing plates developed by a dry thermal transfer process. The plate is made from a photopolymerizable printing element composed of a polymeric binder, an ethylenically unsaturated compound, and a polymerization photoinitiator. The process includes exposing the photopolymerizable element through an image-bearing transparency, heating the element to a temperature between the flow temperatures of the exposed and the unexposed areas, and absorbing molten unexposed material into a porous matrix element by pressing into contact the element and the porous matrix element. The heating operating temperature is between 40 and 260° C. The photopolymerizable layer of the element may include dyes and pigments, as well as fillers or reinforcing agents of sufficiently small particle size to penetrate the porous material.

Even though thermal processing of flexographic plates was disclosed by Martens in U.S. Pat. Nos. 5,015,556; 5,175,072; and 5,215,859, there was no comparative analysis of the differences in plate performance between the thermally processed plates and solvent processed plates. Dramatic reduction in plate performance have been found as a result of thermal processing of plates. Problems have also been found with thermal development of photosensitive elements having the one or more additional layers on the photopolymerizable layer. The additional layers may not be adequately removed by heating at the temperature sufficient to soften (or melt) to remove the unpolymerized portions of the photopolymerizable layer. All or parts of the additional layers may remain on the photosensitive element even after multiple cycles of heating and contacting with an absorbant material that are conducted in thermal development. The portions of the additional layer/s that remain after thermal development can alter the relief depth, reverse depth, and surface of the plate and therefore detrimentally impact printing performance of the plate.

Further, it is desireable to minimize the time and temperature at which the photosensitive element is held during thermal development to maintain the productivity of the system and to avoid distortion of the support or distortion of the fine image areas on the plate. Yet the desire to minimize time and temperature for thermal development must be balanced with the need to thoroughly remove (i.e., clean out) the unpolymerized areas from the photopolymerized layer including the fine reverses as well as remove the one or more additional layers. The unpolymerized areas must be removed to form sufficient printing relief to use the element as a plate. The additional layers must also be removed particularly from the surface and in between fine reverses in order for the plate to have quality printing of highlight dots, fine lines, mid-tones and fine reverses. Thus, a thermally processed photosensitive element should provide good processing latitiude and excellent printing quality regardless of screen ruling.

SUMMARY OF THE INVENTION

It is an object to provide a process for making a flexographic printing plate in which one or more additional layers disposed above a photopolymerizable layer of a photosensitive element are thoroughly removed with unexposed portions of the photopolymerizable layer upon thermal development.

It is another object of this invention to provide a photosensitive element having one or more additional layers disposed above a photopolymerizable layer and a process for thermally developing the photosensitive element that are not limited by the melting or softening temperature associated with material or materials in the one or more additional layers on the photopolymerizable layer.

It is a further object of this invention to provide a process for making a flexographic printing plate that reduces the time for thermal development at a developing temperature suitable for removal of unpolymerized portions of a photopolymerizable layer as well as one or more additional layers on the photopolymerizable layer.

It is a still further object of this invention to provide a photosensitive element suitable for thermal development which has good processing latitude and provides quality print performance regardless of screen ruling.

In accordance with this invention there is provided a process for making a flexographic printing plate comprising providing a photosensitive element which comprises at least one photopolymerizable layer on a support comprising an elastomeric binder, at least one monomer, and a photoinitiator, and at least one thermally removable layer disposed above the photopolymerizable layer. The thermally removable layer is selected from the group consisting of: (a) an actinic radiation opaque layer comprising (i) at least one infrared absorbing material, (ii) a radiation opaque material, wherein (i) and (ii) can be the same or different, and at least one binder having a softening or melting temperature less than 190° C.; (b) a layer of a composition comprising at least one binder and filler, wherein the binder is less than 49% by weight based on the total weight of the binder and filler, and (c) a layer of particulate material having particle size of less than 23 micrometers. The process includes imagewise exposing the photopolymerizable layer to actinic radiation forming polymerized portions and unpolymerized portions and thermally treating the imagewise exposed element by heating to a temperature sufficient to remove the thermally removable layer and to remove the unpolymerized portions of the photopolymerizable layer and form a relief.

In accordance with another aspect of this invention there is provided a photosensitive element for use as a flexographic printing plate comprising (a) at least one photopolymerizable layer on a support comprising an elastomeric binder, at least one monomer and a photoinitiator, wherein the photopolymerizable layer in an unexposed state is capable of melting, softening, or flowing at a treating temperature of at least 40° C., and (b) at least one thermally removable layer disposed above the photopolymerizable layer, wherein the thermally removable layer comprises at least one binder and a filler, wherein the binder is less than 49% by weight based on the total weight of the binder and filler.

DESCRIPTION OF THE PREFERRED EMBODIMENT(S)

The process of the present invention prepares a flexographic printing plate from a photosensitive element comprising a photopolymerizable layer and at least one thermally removable layer thereon and includes the steps of imagewise exposing, and thermally treating to form a relief surface. The photosensitive element is able to withstand the conditions associated with thermal processing. Uncured portions of the photopolymerizable layer as well as the thermally removable layer/s thereon can be effectively removed to provide a relief plate suitable for high quality flexographic printing. In addition, the photosensitive element used in the present process is able to reproduce the fine picture elements from the desired image without distortion. Such a photosensitive element will allow one to use processing conditions that will not be detrimental to the fine features of the plate and/or a support for the element. Additionally, the photopolymerizable elastomeric layer of the photosensitive elements useful in this invention can be effectively processed in less number of cycles of heating and contacting and/or at lower temperatures. Also, the photosensitive element provides wide exposure and processing latititude.

The first step of the present process is to provide a photosensitive element. The photosensitive element comprises, in order, a support, at least one photopolymerizable layer, and at least one thermally removable layer on the photopolymerizable layer. As used herein, the term "photopolymerizable" is intended to encompass systems that are photopolymerizable, photocrosslinkable, or both. The photopolymerizable layer is formed of a composition comprising a thermoplastic binder, at least one monomer and a photoinitiator. The thermoplastic binder is preferably is elastomeric. The photoinitiator has sensitivity to actinic radiation. Throughout this specification actinic light will include ultraviolet radiation and/or visible light. The photopolymerizable composition is capable of partially liquefying upon thermal development. That is, during thermal development the uncured composition must soften or melt or flow at a reasonable processing or developing temperature but not be subject to cold flow, i.e., dimensional change, during normal storage.

The thermoplastic binder can be a single polymer or mixture of polymers. Binders include natural or synthetic polymers of conjugated diolefin hydrocarbons, including polyisoprene, 1,2-polybutadiene, 1,4-polybutadiene, and butadiene/acrylonitrile. Preferably, the thermoplastic binder is an elastomeric block copolymer of an A-B-A type block copolymer, where A represents a non-elastomeric block, preferably a vinyl polymer and most preferably polystyrene, and B represents an elastomeric block, preferably polybutadiene or polyisoprene. Suitable thermoplastice elastomeric binders of this type include poly(styrene/isoprene/styrene) block copolymers and poly(styrene/butadiene/styrene) block copolymers which are preferred. The non-elastomer to elastomer ratio is preferably in the range of from 10:90 to 35:65. Most preferably the thermoplastic elastomeric binder is a mixture of at least two poly(styrene/isoprene/styrene) block copolymers as described by Dudek et al. in U.S. Pat. No. 5,972,565. It is preferred that the binder be present in an amount of at least 60% by weight of the photosensitive layer.

The term binder, as used herein, encompasses core shell microgels and blends of microgels and preformed macromolecular polymers, such as those disclosed in Fryd et al., U.S. Pat. No. 4,956,252 and Quinn et al., U.S. Pat. No. 5,707,773.

Other suitable photosensitive elastomers that may be used include polyurethane elastomers. An example of a suitable polyurethane elastomer is the reaction product of (i) an organic diisocyanate, (ii) at least one chain extending agent having at least two free hydrogen groups capable of polymerizing with isocyanate groups and having at least one ethylenically unsaturated addition polymerizable group per molecule, and (iii) an organic polyol with a minimum molecular weight of 500 and at least two free hydrogen containing groups capable of polymerizing with isocyanate groups. For a more complete description of some of these materials see U.S. Pat. No. 5,015,556.

The photopolymerizable composition contains at least one compound capable of addition polymerization that is compatible with the binder to the extent that a clear, non-cloudy photosensitive layer is produced. The at least one compound capable of addition polymerization may also be referred to as a monomer and can be a single monomer or mixture of monomers. Monomers that can be used in the photopolymerizable composition are well known in the art and include, but are not limited to, addition-polymerization ethylenically unsaturated compounds with at least one terminal ethylenic group. Generally the monomers have relatively low molecular weights (less than about 30,000). Preferably, the monomers have a relatively low molecular weight less than about 5000. Examples of suitable monomers include, but are not limited to, t-butyl acrylate, lauryl acrylate, the acrylate and methacrylate mono- and polyesters of alcohols and polyols such as alkanols, such as hexanediol diacrylate and hexanediol dimethacrylate; alkylene glycols, such as ethylene glycol diacrylate, ethylene glycol dimethacrylate, and diethylene glycol diacrylate; trimethylol propane, such as trimethylol propane triacrylate; ethoxylated trimethylol propane; pentaerythritol; dipentaerythritol; polyacrylol oligomers, and the like. If a polyacrylol oligomer is used, the oligomer should preferably have a molecular weight greater than 1000. A mixture of monofunctional and multifunctional acrylates or methacrylates may be used. Other examples of suitable monomers include acrylate and methacrylate derivatives of isocyanates, esters, epoxides and the like. Monomers can be appropriately selected by one skilled in the art to provide elastomeric property to the photopolymerizable composition. Examples of elastomeric monomers include, but are not limited to, acrylated liquid polyisoprenes, acrylated liquid butadienes, liquid polyisoprenes with high vinyl content, and liquid polybutadienes with high vinyl content, (that is, content of 1–2 vinyl groups is greater than 20% by weight). Further examples of monomers can be found in Chen U.S. Pat. No. 4,323,636; Fryd et al., U.S. Pat. No. 4,753,865; Fryd et al., U.S. Pat. No. 4,726,877 and Feinberg et al., U.S. Pat. No. 4,894,315. The compound capable of addition polymerization (monomer) is present in at least an amount of 5%, preferably 10 to 20%, by weight of the elastomeric composition.

The photoinitiator can be any single compound or combination of compounds which is sensitive to actinic radiation, generating free radicals which initiate the polymerization of the monomer or monomers without excessive termination. Any of the known classes of photoinitiators, particularly free radical photoinitiators such as quinones, benzophenones, benzoin ethers, aryl ketones, peroxides, biimidazoles, benzyl dimethyl ketal, hydroxyl alkyl phenyl acetophone, dialkoxy actophenone, trimethylbenzoyl phosphine oxide derivatives, aminoketones, benzoyl cyclohexanol, methyl thio phenyl morpholino ketones, morpholino phenyl amino ketones, alpha halogennoacetophenones, oxysulfonyl ketones, sulfonyl ketones, oxysulfonyl ketones, sulfonyl ketones, benzoyl oxime esters, thioxanthrones, camphorquinones, ketocouumarins, Michler's ketone may be used. Alternatively, the photoinitiator may be a mixture of compounds, one of which provides the free radicals when caused to do so by a sensitizer activated by radiation. Preferably, the initiator is sensitive to visible or ultraviolet radiation. Photoinitiators are generally present in amounts from 0.001% to 10.0% based on the weight of the photopolymerizable composition.

Optionally, the photopolymerizable layer can contain spectral sensitizing agents. In general, spectral sensitizing agents are those materials that absorb radiation at a wavelength different than that of the reaction-initiating component, i.e., photoinitiator, and are capable of transferring the absorbed energy to the photoinitiator. Thus, the wavelength of the activating radiation can be adjusted.

The photopolymerizable layer can contain other additives depending on the final properties desired. Additional additives to the photopolymerizable layer include sensitizers, plasticizers, rheology modifiers, thermal polymerization inhibitors, colorants, processing aids, antioxidants, antiozonants, and fillers. Processing aids may be such things as low molecular weight polymers compatible with the elastomeric block copolymer, such as low molecular weight alpha-methylstyrene polymer or copolymer. Antiozonants include hydrocarbon waxes, norbornenes, and vegetable oils. Suitable antioxidants include alkylated phenols, alkylated bisphenols, polymerized trimethyldihydroquinone, and dilauryl thiopropinoate.

Plasticizers are used to adjust the film forming properties of the elastomer. Examples of suitable plasticizers include aliphatic hydrocarbon oils, e.g., naphthenic and paraffinic oils; liquid polydienes, e.g., liquid polybutadiene; and liquid polyisoprene. Generally, plasticizers are liquids having molecular weights of less than about 5000, but can have molecular weights up to about 30,000. Plasticizers having low molecular weight will encompass molecular weights less than about 30,000.

Flexographic printing plates formed from photopolymerizable compositions which are soluble, swellable, or dispersible in aqueous, semi-aqueous, or organic solvent developers (so called wet development) may also be suitable for use in the present invention to the extent that the photopolymerizable composition is also capable of liquifying upon thermal development to form a relief surface. Examples of suitable compositions for solvent development have been disclosed, for example, in Chen et al., U.S. Pat. No. 4,323, 637, Grüetzmacher et al., U.S. Pat. No. 4,427,749 and Feinberg et al., U.S. Pat. No. 4,894,315.

The thickness of the photopolymerizable layer can vary over a wide range depending upon the type of printing plate desired, for example, from about 0.010 inches to about 0.250 inches or greater (about 0.025 cm to about 0.64 cm or greater). For so-called "thin plates" typically the photopolymerization layer can range from about 0.010 inches to about 0.067 inches (about 0.025 cm to about 0.17 cm) in thickness.

The support can be any flexible material that is conventionally used with photosensitive elements used to prepare flexographic printing plates. Preferably the support is transparent to actinic radiation to accommodate "backflash" exposure through the support. Examples of suitable support materials include polymeric films such those formed by addition polymers and linear condensation polymers, transparent foams and fabrics. Under certain end-use conditions, metals such as aluminum, may also be used as a support, even though a metal support is not transparent to radiation. A preferred support is a polyester film; particularly preferred is polyethylene terephthalate. The support may be in sheet form or in cylindrical form, such as a sleeve. The sleeve may be formed from single layer or multiple layers of flexible material. Flexible sleeves made of polymeric films are preferred, as they typically are transparent to ultraviolet radiation and thereby accommodate backflash exposure for building a floor in the cylindrical printing element. Multiple layered sleeves may include an adhesive layer or tape between the layers of flexible material. Preferred is a multiple layered sleeve as disclosed in U.S. Pat. No. 5,301,610. The sleeve may also be made of non-transparent, actinic radiation blocking materials, such as nickel or glass epoxy. The support typically has a thickness from 0.002 to 0.050 inch (0.0051 to 0.127 cm). A preferred thickness for the sheet form is 0.003 to 0.016 inch (0.0076 to 0.040 cm). The sleeve typically has a wall thickness from 10 to 80 mils (0.025 to 0.203 cm) or more. Prefered wall thickness for the cylinder form is 10 to 40 mils (0.025 to 0.10 cm).

Optionally, the element includes an adhesive layer between the support and the photopolymerizable layer, or a surface of the support that is adjacent the photopolymerizable layer has an adhesion promoting surface. The adhesive layer on the surface of the support can be a subbing layer of an adhesive material or primer or an anchor layer as disclosed in U.S. Pat. No. 2,760,863 to give strong adherence between the support and the photopolymerizable layer. The adhesive compositions disclosed in Burg, U.S. Pat. No. 3,036,913 are also effective. Alternatively, the surface of the support on which the photopolymerizable layer resides can be treated to promote adhesion between the support and the photopolymerizable layer, with flame-treatment or electron-treatment, e.g., corona-treated. Further, the adhesion of the photopolymerizable layer to the support can be adjusted by exposing the element to actinic radiation through the support as disclosed by Feinberg et al. in U.S. Pat. No. 5,292,617.

The photopolymerizable layer itself can be prepared in many ways by admixing the binder, monomer, initiator, and other ingredients. It is preferred that the photopolymerizable mixture be formed into a hot melt and then calendered to the desired thickness. An extruder can be used to perform the functions of melting, mixing, deaerating and filtering the composition. The extruded mixture is then calendered between the support and a temporary coversheet. Alternatively, the photopolymerizable material can be placed between the support and the temporary coversheet in a mold. The layers of material are then pressed flat by the application of heat and/or pressure. Cylindrical seamless photopolymerizable elements may be prepared according to the method and apparatus disclosed by Cushner et al. in U.S. Pat. No. 5,798,019.

The photosensitive element includes at least one photopolymerizable layer that can be of a bi- or multi-layer construction. Further, the photosensitive element may include an elastomeric capping layer on the at least one photopolymerizable layer. The elastomeric capping layer should have an elastic modulus in the polymerized state not substantially less than the elastic modulus of the photopolymerizable layer in the exposed state. The composition of the elastomeric layer comprises an elastomeric polymeric binder, an optional second polymeric binder and optionally a nonmigratory dye or pigment. The elastomeric composition can also contain a monomer or monomers and a photoinitiating system. The elastomeric polymeric binder in the elastomeric composition is generally the same as or similar to the elastomeric binder present in the photopolymerizable layer. The elastomeric capping layer is typically part of a multilayer cover element that becomes part of the photosensitive printing element during calendering of the photopolymerizable layer. Such multilayer cover elements and compositions suitable as the elastomeric capping layer are disclosed in Gruetzmacher et al., U.S. Pat. No. 4,427,759 and U.S. Pat. No. 4,460,675. Although the elastomeric capping layer may not necessarily contain photoreactive components, the layer ultimately becomes photosensitive when in contact with the photopolymerizable layer. As such, upon imagewise exposure to actinic radiation, the elastomeric capping layer has portions in which polymerization or crosslinking have occurred and portions which remain unpolymerized, i.e., uncrosslinked. Thermal treating at the developing temperature causes the unpolymerized portions of the elastomeric capping layer to soften or melt or flow along with the photopolymerizable layer, in order to form the relief surface. The elastomeric capping layer that has been exposed to actinic radiation remains on the surface of the polymerized areas of the photopolymerizable layer and becomes the actual printing surface of the printing plate.

The photosensitive element includes at least one thermally removeable layer on the photopolymerizable layer. Depending on desired use, the thermally removable layer may be opaque or transparent to actinic radiation. The at least one thermally removable layer may have one or more functions for the photosensitive element including, but not limited to, a release layer, an actinic radiation opaque layer, a barrier layer (typically in conjunction with the actinic radiation opaque layer), an adhesion modifying layer, and a layer which alters the surface characteristics of the photosensitive element. The thermally removable layer should be substantially insensitive to the radiation that induces photoreaction in the photopolymerizable layer, which typically is ultraviolet radiation.

The primary purposes of a release layer are for ease in placing and removing an image-bearing transparency onto and from the photopolymerizable surface after exposure in a vacuum frame. (An image-bearing transparency may also be referred to herein as a mask, target, silver halide target, and phototool.) The release layer provides a substantially non-tacky surface to the typically tacky surface of the photopolymerizable layer. The release layer can also protect the surface of the photopolymerizable layer from being damaged during removal of an optional temporary coversheet and can ensure that the photopolymerizable layer does not stick to the coversheet. When the thermally removable layer is functioning as a release layer, the layer is transparent or substantially transparent, i.e., insensitive or substantially insensitive, to actinic radiation. A transparent or substantially transparent layer is one that permits all or at least a significant portion of the transmitted amount of actinic radiation to the underlying photopolymerizable layer so that a significant amount of photoinduced reaction occurs in the photopolymerizable layer. The thermally removable layer is also substantially transparent to actinic radiation when acting as an adhesion modifying layer and when altering the surface characteristics, such as surface roughness, ink pickup, or ink release properties of the photosensitive element. A sufficiently roughened exterior surface of the photosensitive element can eliminate the need for matte agent in films that are used as phototools (i.e., transparency mask). The matte agent in the phototool assures intimate contact between the phototool and the element upon exposure in vacuum.

When the thermally removeable layer is the actinic radiation opaque layer, the layer is opaque or substantially opaque to actinic radiation. An opaque or substantially opaque layer is one in which the amount of actinic radiation transmitted to the underlying photopolymerizable layer is so minuscule that no significant amount of photoinduced reaction occurs in the photopolymerizable layer. When acting as the actinic radiation opaque layer, the thermally removable layer may completely cover or only partially cover the underlying photopolymerizable layer for the photosensitive element prior to the imagewise exposure step. If the actinic radiation opaque layer completely covers the underlying photopolymerizable layer, the actinic radiation opaque layer is first removed imagewise from the photosenstive element to uncover the photopolymerizable layer. The thermally removable layer as the radiation opaque layer forms the in situ mask on the photosensitive element for imagewise exposure of the photopolymerizable layer. The actinic radiation opaque layer typically is also sensitive to infrared radiation that is used to form the in situ mask. The in situ mask of the radiation opaque layer may be formed by any method including imagewise ablation of the radiation opaque layer by infrared laser radiation from the photosensitive element, imagewise transfer of the radiation opaque layer by infrared laser radiation from a donor element to the photosensitive element, imagewise adhesion balance change by infrared laser radiation between a substrate and the photosensitive element and inkjet application methods. It is possible to use more than one layer (thermally removable) to form the actinic radiation opaque layer. When the thermally removable layer is the actinic radiation opaque layer, the opaque areas should have a transmission optical density (visual filter) of greater than 2.0 in order to effectively block actinic radiation and the polymerization of the underlying photopolymerizable layer. The in situ mask remains on the photopolymerizable layer after imagewise exposure, and is removed during thermal treating.

The thickness of the thermally removable layer should be in the range suitable for its intended purpose. When the thermally removeable layer is acting as the release layer, the thickness is less than 25 micron, preferably less than 15 microns. When the thermally removable layer is acting as the radiation opaque layer, the thickness should be in a range to optimize both sensitivity and opacity, which is generally from about 20 Angstroms to about 50 micrometers, preferably 20 Angstroms to 25 micrometers. For photosensitive elements having more than one thermally removable layer, the total thickness of the layers should be as thin as possible, that is, less than 75 microns, preferably less than 50 microns.

The thermally removeable layer is selected from the group consisting of (a) an actinic radiation opaque layer comprising (i) at least one infrared absorbing material, (ii) a radiation opaque material, wherein (i) and (ii) can be the same or different, and at least one binder having a softening or melting temperature less than 190° C.; (b) a layer of a composition comprising at least one binder and filler agent, wherein the binder is less than 49% by weight based on the total weight of the binder and filler agent, and (c) a layer of particulate material having particle size of less than 23 micrometers. Depending upon the selection of materials used in the thermally removable layer (b) and (c), the thermally removable layer may function as a release layer, protective layer, surface altering layer, adhesion modifying layer, or as a digitally imageable layer, i.e., an actinic radiation opaque layer.

The thermally removable layer of the group (a) is an actinic radiation opaque layer comprising (i) at least one infrared absorbing material, (ii) a radiation opaque material, wherein (i) and (ii) can be the same or different, and at least one binder having a softening or melting temperature less than 190° C. The binder for the thermally removable layer (a) is at least 51% by weight, based on the total weight of binder, the radiation opaque material and the infrared absorbing material. Since the binder is present in greater proportion than the radiation opaque material and/or the infrared absorbing material, the thermally removable layer (a) forms a continuous film disposed above the photopolymerizable layer.

To the extent that the following binders have a softening or melting temperature less than 190° C., the binders which are suitable for use in the actinic radiation opaque layer (a) include, but are not limited to, polyamides, polyethylene oxide, polypropylene oxide, ethylcellulose, hydroxyethyl cellulose, cellulose acetate butyrate, ethylene-propylene-diene terpolymers, copolymers of ethylene and vinyl acetate, copolymers of vinyl acetate and vinyl alcohol, copolymers of vinyl acetate and pyrrolidone, polyvinyl acetate, polyethylene wax, polyacetal, polybutyral, polyalkylene, polycarbonates, polyester elastomer, copolymers of vinyl chloride and vinyl acetate, copolymers of styrene and butadiene, copolymers of styrene and isoprene, thermoplastic block copolymers of styrene and butadiene, thermoplastic block copolymers of styrene and isoprene, polyisobutylene, polybutadiene, polycholorprene, butyl rubber, nitrile rubber, thermoplastic polyurethane elastomer, cyclic rubbers, copolymers of vinylacetate and (meth)acrylate, acrylonitrile-butadiene-styrene terpolymer, methacrylate-butadiene-styrene terpolymer, alkyl methacrylate polymer or copolymer, copolymers of styrene and maleic anhydride, copolymers of styrene and maleic anhydride partially esterified with alcohols, and combinations thereof. Some of the above materials, particularly the copolymeric elastomeric compounds do not have a actual softening or melting point, but rather transition from a viscous or rubbery condition to a hard relatively brittle condition which is expressed as a glass transition temperature, Tg. Preferred binders having a softening or melting temperature less than 190° C. include polyamides, polyethylene oxide, polypropylene oxide, ethylcellulose, hydroxyethyl cellulose, cellulose acetate butyrate, ethylene-propylene-diene terpolymers, copolymers of ethylene and vinyl acetate, copolymers of vinyl acetate and vinyl alcohol, copolymers of vinyl acetate and pyrrolidone, polyvinyl acetate, polyethylene wax, polyacetal, polybutyral, polyalkylene, polycarbonates, cyclic rubber, copolymer of styrene and maleic anhydride, copolymer of styrene and maleic anhydride partially esterified with alcohol, polyester elastomers, and combinations thereof.

Materials suitable for use as the radiation opaque material and the infrared absorbing material include, but is not limited to, metals, metal alloys, pigments, carbon black, graphite and combinations thereof. Mixtures of pigments in which each pigment functions as the infrared absorbing material, or the radiation opaque material (or both) can be used with the binder. Dyes are also suitable as infrared absorbing agents. Examples of suitable dyes include poly (substituted)phthalocyanine compounds; cyanine dyes; squarylium dyes; chalcogenopyrloarylidene dyes; bis (chalcogenopyrylo)-polymethine dyes; oxyindolizine dyes; bis(aminoaryl)-polymethine dyes; merocyanine dyes; croconium dyes; metal thiolate dyes; and quinoid dyes. Preferred is carbon black, graphite, metal, and metal alloys that functions as both the infrared absorbing material and the radiation opaque material. The radiation opaque material and the infrared absorbing material may be in dispersion as described below to facilitate handling and uniform distribution of the material. Typically, the radiation opaque material and the infrared absorbing materials have melting temperatures above the treating temperature.

The thermally removable layer of the group (b) is a layer of a composition comprising at least one binder and filler, wherein the binder is less than 49% by weight based on the total weight of the binder and filler. The binder for the thermally removable layer can be from 1 to 49% by weight, based on the total weight. Since the amount of binder in the thermally removable layer (b) is less than 49% by weight, the filler is present at least 51% by weight based on the total amount of binder and filler in the layer (b). The filler in the thermally removable layer (b) of at least 51% by weight forms a discontinuous layer with the binder. The thermally removable layer (b) being a discontinous layer is particularly useful when the binder for layer (b) has a melting point or softening point above 190° C. During thermal treatment, the application of heat and contacting with the absorbent material, preferably with added pressure, aids in the formation of microcracks in the discontinuous layer so that the thermally removable layer and the underlying unpolymerized portions of the photopolymerizable layer can be thoroughly removed during treatment. Microcracks are breaks, fractures, or cracks which are small, that is, on the order of microns or significantly less in size. The filler, or an inorganic dispersion of the filler, will not form a film by itself. Generally, a binder alone is capable of forming a film. But when the binder has a melting or softening temperature above the treating temperature (i.e., greater than 200° C.) and forms a continuous layer with a filler (that is, the binder is in a greater porportion to the filler) on the photopolymerizable layer, the layer does not melt, soften, or flow during thermal treating and results in incomplete removal of the resulting layer and/or the unpolymerized portions. Binders having a melting point or softening point below 190° C. are also suitable for use in the thermally removable layer (b). Thus, the melting point or softening point of a material or materials in a layer disposed above the photopolymerizable layer is not longer a limitation of a photosensitive element for use in a thermal development process. (See Examples 7 and 8.) It is also possible to include one or more additional binders with the binder of thermally removable layer (b). The coating thickness of the thermally removable layer (b) should be less than 50 micrometers, preferably less than 25 micrometers.

Binders suitable for use in the thermally removable layer (b) include, but are not limited to, polyvinyl alcohol, poly (meth)acrylic acids, metal alkali salts of poly(meth)acrylic acids, amphoteric interpolymers, hydroxyalkyl cellulose, cellulose acetate, nitrocellulose, polyimides, polyesters, polyphenylene ethers, polyacrylonitrile, polystyrene, copolymers of styrene and methacrylic acid, polyvinyl chloride, polyesters, polyacrylamide, copolymers of imides and amides, polychlorotrifluoroethylene, ethylene and chlorotrifluroethylene copolymer, polytetra fluoroethylene, copolymers of ethylene and tetrafluroethylene copolymer, polyether ether ketone, polybenzimidazoles, copolymers of vinylidene fluoride and hexafluoropropylene, and combinations thereof. The binders recited above for the thermally removable layer (a) are also suitable as binders for the thermally removable layer (b).

A dispersant is generally added when a pigment or a filler is present in order to disperse the fine particles and avoid flocculation and agglomeration. A wide range of dispersants is available. Suitable dispersants are the A-B dispersants generally described in "Use of A-B Block Polymers as Dispersants for Non-Aqueous Coating Systems" by H. K. Jakubauskas, *Journal of Coating Technology*, Bol. 58, Number 736, pages 71–82. Useful A-B dispersants are disclosed in U.S. Pat. Nos. 3,684,771; 3,788,996; 4,070,388, and 4,032,698. The dispersant is generally present in the thermally removable layer in an amount of 0.1 to 20% by weight, based on the total weight of the layer. But, the amount of dispersant for the filler is not included when determining the weight percentage of the binder or the filler in the thermally removable layer (b).

The filler can have color or be colorless. If the filler has color, it is preferred that the thermally removable layer (b) should be opaque to actinic radiation. Materials suitable for use as the filler include mineral fillers, such as, calcium carbonate, kaolin, feldspar, synthetic silica, natural silica, talc, silicon carbide, aluminum oxides, beryllium oxide, iron oxide, lead oxide, magnesium oxide, titanium oxide, zinc oxide, zirconium oxide, glass with or without surface treatment, sulfates, sulfides, silicates and titanates; metallic fillers, such as iron, steel, aluminum, copper, nickel, silver, zinc, lead, metallized glass; metallic alloys, such as, zinc and copper; flame retardants, such as, antimony oxide, alumina trihydrate, phosphorus; organic fillers, such as woodflour, starches and synthetic materials such as crosslinked particles of polymethylmethacrylate; carbon black; graphite; pigments; and combinations thereof. Fillers may also function as infrared absorbing materials and uv absorbing materials. Preferred are carbon black, graphite, silica, metallic fillers, metal alloys, pigments, and crosslinked organic fillers. It is preferred to use a filler having fine particle size which is in dispersion. The particle size of the filler is less than 23 micrometers, and preferably less than 17 micrometers. The shape of the particles of filler is not limited.

Other additives, such as dispersants, surfactants, rheology modifiers, may also be present in the thermally removable layers (a) and (b).

The thermally removable layer of the group (c) is a layer of particulate material having particle size of less than 23 micrometers. The particulate material is a fine powder of particules in which at least 90 percent by volume of the particulate material has a particle size of an equivalent spherical diameter of less than 23 micrometers. It is preferred that at least 50 percent by volume of the particulate material has a particle size of an equivalent spherical diameter of less than 17 micrometers.

For the purpose of determining particle size of the particulate material for layer (c) as well as the filler for layer (b), particles are measured with a Coulter® Multisizer instrument, Coulter Electronics, Inc., Hialeah, Fla. The term particle size as used herein with respect to the particulate material and filler covers the size distribution of the smallest, independently acting unit. The particle size is based upon an equivalent spherical diameter of each particle. The size of particles suitable for use as the particulate material in the thermally removable layer (c) and the filler for layer (b) is less than 23 microns (micrometers), and preferably less than 17 micrometers. Based on a volumetric distribution of particulate material sampled, at least 90% of the particulate material must have a particle size of less than 23 microns, and at least 50% of the particluate material must have a particle size less than 17 microns. The shape of the particles of the particulate material is not limited.

The surface of the photopolymerizable layer opposite the support is an exterior surface which is tacky or substantially tacky, i.e., be sticky or have an oilyness to the touch of the surface of the layer. The exterior surface should be tacky enough to secure an overall layer of particulate material on the surface of the element. Typically, the surface of the photopolymerizable layer is inherently tacky due to the elastomeric binder and/or to migratory compounds, such as monomer and plasticizer, in the photopolymerizable layer. In most cases, the particulate material will be applied directly to the photopolymerizable layer since the photopolymerizable layer is tacky and will adhere the particulate material to the element. If more than one photopolymeizable layer is present in the element, the exterior surface of the outermost layer must be tacky or substantially tacky. After application of the particulate material to the tacky exterior surface of the photopolymerizable layer, the surface or a portion of the surface is rendered tack-free or substantially tack-free. The layer of particulate material may be a monolayer or multiple layers to render the exterior surface tack-free. The thermally removable layer (c) of particulate material may entirely cover or partially cover the photopolymerizable layer. The particulate material can be colorless to form a transparent or substantially transparent layer on the photosensitive element. Alternately, the particulate material can be colored which includes black, to form the actinic radiation opaque layer on the element.

The particulate material can be organic, inorganic, metallic, metallic alloys, pigments, carbon black, graphite, mixtures of organic and inorganic compounds, or multicomponent. Materials suitable for use as the particulate material include, but are not limited to, polyethylene powders; polytetrafluoroethylene powders; diatomaceous silicas; cellulose acetates; polyvinyl alcohol powders; matte agents, such as, silica, rice starch, and polymethylmethacrylate powders; and inorganic particles, such as, titanium dioxide, zinc oxide, magnesium oxide, and alumina. Additional materials suitable for use as the particulate material are pigment particles; toner particles; mixtures of pigment particles; mixtures of toner particles; and mixtures of pigment and toner particles. Non-limiting examples of pigment particles include carbon black; graphite; copper chromite; chromium oxides; cobalt chrome aluminate; metals, such as, aluminum, copper, and zinc; and metal alloys of bismuth, indium, zinc, and copper. Toner particles are pigmented organic resin particles that comprise pigment particles finely dispersed in a resin matrix that is then ground to the desired size.

Suitable resin matrices for the toners include, but are not limited to, polyamides, polyethylene oxide, polypropylene oxide, ethylcellulose, hydroxyethyl cellulose, cellulose acetate butyrate, ethylene-propylene-diene terpolymer, copolymers of ethylene and vinyl acetate, copolymers of vinyl acetate and vinyl alcohol, copolymers of vinyl acetate and pyrrolidone, polyvinyl acetate, polyethylene wax, polyacetal, polybutyral, polyalkylene, polycarbonates, polyester elastomer, copolymers of vinyl chloride and vinyl acetate, cyclic rubbers, copolymers of vinylacetate and (meth)acrylate, acrylonitrile-butadiene-styrene terpolymer, methacrylate-butadiene-styrene terpolymer, alkyl methacrylate polymer or copolymer, copolymers of styrene and maleic anhydride, copolymers of styrene and maleic anhydride partially esterified with alcohols, polyvinyl alcohol, poly(meth)acrylic acids, metal alkali salt of poly(meth) acrylic acids, amphoteric interpolymers, cellulose acetate, nitrocellulose, polyimides, polyesters, polyphenylene ethers, polyacrylonitrile, polystyrene, copolymers of styrene and methacrylic acid, polyvinyl chloride, polyacrylamide, copolymers of imides and amides, polychlorotrifluoroethylene, ethylene and cholrotrifluroethylene copolymer, polytetrafluoroethylene, copolymers of ethylene and tetrafluroethylene, polyether ether ketone, polybenzimidazoles, copolymers of vinylidene fluoride-hexafluoropropylene copolymer and mixtures thereof. Preferred resin matrices are polyvinyl chloride, cellulose acetate, cellulose acetate butyrate, polystyrene, polymethyl methacrylate, polyvinyl alcohol, methyl cellulose, and carboxymethyl cellulose. Particulate materials may be dispersed with wetting agents, dispersants, extenders, softeners, and other adjuvants to adjust particle size and to facilitate handling or in the process of use. The surface of the particulate material may be modified with for example, antistatic agents and slip agents, to provide particles with desired characteristics. Particle size may be adjusted to attain the desired particle size by, for example, milling.

Particularly preferred toners are toners sold by DuPont as Cromalin® black toners, for example, Cromalin® type KK6 black toner which is carbon black and cellulose acetate blend. Particularly preferred particulate materials for forming a radiation opaque layer are carbon black, graphite, mixtures of pigments, toners containing carbon black, metals and metal alloys, such as copper, zinc, and aluminum, and a mixture thereof.

The particulate material can include additives to improve covering power and uniform application of the particulate material as a layer. The particulate material may be dispersed with wetting aids, surfactants, extenders, softeners, and other adjuvants to adjust paricle size and to facilitate handling or in the process of use. The surface of the particles of particulate material can be modified with for example, antistatic agents and slip agents, to provide the particles with desired characteristics.

When the particulate material is applied to the photopolymerizable layer it imparts a dry, non-tacky finish to the surface of the photosensitive element. The particulate material can be applied to the surface of the photosensitive element opposite the support by any method including, hand dusting or by mechanical means, such as applicators and automated toning machines, with dry powder, and powder coating. Hand application is usually accomplished by dipping a pad of tufted material into a tray of particulate material, applying the particulate material in excess and wiping the pad over the entire surface of the photosensitive element. Excess material is then wiped off. The particulate material may also by applied from a liquid dispersion.

It was surprising to find that the particulate materials in the thermally removable layer (c) can be sucessfully thermally processed regardless of the class of material and the melting point of the material (see Examples 3, 4, 5, 6, and 13). The size of the particle of the particulate material is important since particle size influences the ease of removal of the particulate from fine reverses in the relief, and the degree of packing of the particles on the layer (see Examples 6 and 13).

Further particle size is also particularly critical when the layer (c) functions as an actinic radiation opaque layer. The particle size affects the toned density, i.e., degree of packing, and actinic radiation blocking capability of the layer (c). It is also possible to use more than one thermally removable layers or types of thermally removable layers. The exact choice of additional layer(s) will depend on the nature of the photopolymerizable layer, the function of the thermally removable layer, and other physical requirements of the photosensitive element. For example, a second thermally removable layer as defined above may be necessary between the photopolymerizable layer and the thermally removable layer acting as a radiation opaque layer. The second thermally removable layer can act as a barrier layer to protect the integrity of the radiation opaque layer from the migratory materials, such as monomers, plasticizers, and initiators, in the photopolymerizable layer. In such instances, the infrared sensitivity and the handling properties of the thermally removable layer may be altered. In addition, such migration can cause smearing and tackifying of the infrared-sensitive layer after imaging. Additionally, if migratory materials migrated to the thermally removable layer, photocrosslinking in the UV exposed areas of the thermally removable layer may occur and would detrimentally impact the thermal processability of the thermally removable layer. The migration of monomer and/or plasticizer can also reduce the degree of photopolymerization of the exposed areas and reduce the thermal development (removal) capabilities in the unexposed areas of the photopolymerizable layer. Also, migration of materials to the thermally removable layer may adversely impact the adhesion balance between the thermally removable layer and the photopolymerizable layer such that the coversheet of the second element (supporting the thermally removable layer) may not be removable.

The thermally removable layer may be formed above or on the surface of the photopolymerizable layer opposite the support by any method including, coated directly onto the surface of the photopolymerizable layer, or coated separately onto a temporary support or the coversheet and transferred to the surface of the photopolymerizable layer, or formed as a layer of the multilayer cover element which then becomes an assemblage with the photosensitive element, or particulate material toned or applied or transferred to the photopolymerizable layer.

The photosensitive printing element of the present invention may further include a temporary coversheet on top of the uppermost layer of the photosensitive element, that is, the thermally removable layer. One purpose of the coversheet is to protect the uppermost layer of the photosensitive printing element during storage and handling. Examples of suitable materials for the coversheet include thin films of polystyrene, polyethylene, polypropylene, polycarbonate, fluoropolymers, polyamide or polyesters, which can be subbed with release layers. The coversheet is preferably prepared from polyester, such as Mylar® polyethylene terephthalate film; most preferably the coversheet is 5-mil Mylar®.

In preparation for the next step of the process which is to overall expose the photosensitive element to actinic radiation through a mask, a mask image may need to be formed on or disposed above the surface of the photopolymerizable layer opposite the support. The mask includes opaque areas and "clear" areas that form the image. The opaque areas of the mask prevent the photopolymerizable material beneath from being exposed to the radiation and hence those areas of the photopolymerizable layer covered by the dark areas do not polymerize. The "clear" areas of the mask expose the photopolymerizable layer to actinic radiation and polymerize or crosslink. The image necessary for the imagewise exposure of the photopolymerizable layer can be generated by any method including conventional and digital methods, including inkjet application.

Digital methods create a mask image in situ on or disposed above the photopolymerizable layer with laser radiation. Any of the thermally removable layers (a), (b), and (c), which is capable of blocking actinic radiation can be used to form the in situ mask image. Digital methods of creating the mask image require one or more steps to prepare the photosensitive element prior to imagewise exposure. Generally, digital methods of in situ mask formation either selectively remove or transfer the radiation opaque layer, from or to a surface of the photosensitive element opposite the support. It is preferred that the thermally removable layer acting as a radiation opaque layer is also sensitive to infrared radiation in order to carry out the digital methods for forming the mask image with the preferred infrared laser radiation. The presence of materials that are black, such as dark inorganic pigments, such as carbon black and graphite, mixtures of pigments, metals, and metal alloys function as both infrared-sensitive material and radiation-opaque material. The infrared laser exposure can be carried out using various types of infrared lasers, which emit in the range 750 to 20,000 nm. Infrared lasers including, diode lasers emitting in the range 780 to 2,000 nm and Nd:YAG lasers emitting at 1064 nm are preferred. If the color of the powder material is other than black (and not transparent), the wavelength of the laser radiation which forms the in situ mask should be selected so as to be absorbent to the color of the layer and not initiate photoreaction in the laser exposed photopolymerizable layer. The in situ mask images remain on the photosensitive element for subsequent steps of overall exposure to actinic radiation and thermal treating.

In one digital method, the photosensitive element will initially include the thermally removable layer as a radiation opaque layer that covers or substantially covers the entire surface of the photopolymerizable layer. The radiation opaque layer is exposed imagewise to infrared laser radiation to form the image on or disposed above the photopolymerizable layer, i.e., the in situ mask. The infrared laser radiation can selectively remove, e.g., ablate or vaporize, the infrared sensitive layer (i.e., radiation opaque layer) from the photopolymerizable layer, as disclosed by Fan in U.S. Pat. Nos. 5,262,275 and 5,719,009; and Fan in EP 0 741 330 B1. A material capture sheet adjacent the radiation opaque layer may be present during laser exposure to capture the material as it is removed from the photosensitive element as disclosed by Van Zoeren in U.S. Pat. No. 5,506,086. Only the portions of the radiation opaque layer that were not removed from the photosensitive element will remain on the element forming the in situ mask and will become the thermally removable layer for thermal treating.

In another digital method of mask formation, the photosensitive element will not initially include the thermally removable layer. A separate element bearing the thermally removable layer as a radiation opaque layer will form an assemblage with the photosensitive element such that the radiation opaque layer is adjacent the surface of the photosensitive element opposite the support, which is typically the pohotopolymerizable layer. (If present, a coversheet associated with the photopolymerizable layer is removed prior to forming the assemblage). The separate element may include one or more other layers, such as ejection layers or heating layers, to aid in the digital exposure process. Hereto, the radiation opaque layer is also sensitive to infrared radiation. The assemblage is exposed imagewise with infrared laser radiation to selectively transfer the radiation opaque layer and form the image on or disposed above the photopolymerizable layer as disclosed by Fan et al. in U.S. Pat. No. 5,607,814; and Blanchett in U.S. Pat. Nos. 5,766,819; 5,840, 463; and EP 0 891 877 A. Only the portions of the radiation opaque layer which were transferred will reside on the photosensitive element forming the in situ mask and will be the thermally removable layer for thermal treating.

Further, the mask image may be created on a separate carrier and then transferred by application of heat and/or pressure to the surface of the photopolymerizable layer opposite the support. The photopolymerizable layer is typically tacky and will retain the transferred image. The separate carrier can then be removed from the element prior to imagewise exposure. The separate carrier may have a radiation opaque layer that is imagewise exposed to laser radiation to selectively remove the radiation opaque material and form the image. An example of this type of carrier is LaserMask® imaging film by Rexam, Inc. Alternatively, the image of radiation opaque material may be transferred to the separate carrier from another element having the radiation opaque material by laser radiation.

It is also contemplated that digital mask formation can be acomplished by imagewise application of the radiation opaque material in the form of inkjet inks. Inkjet inks may be formulated according to the description above for any of the thermally removable layers (a), (b), and (c). Imagewise application of an ink-jet ink can be directly on the photopolymerizable layer or disposed above the photopolymerizable layer on another thermally removable layer, e.g., transparent layer, of the photosensitive element. (See Example 10)

The next step of the process of the present invention is to overall expose the photosensitive element to actinic radiation through a mask, that is, imagewise exposure of the element. If the digital mask was formed in situ on the photosensitive element, the element is overall exposed through the in situ mask image.

Alternatively, a conventional method for imagewise exposure is by using an image-bearing transparency film or phototool, typically a silver halide film, as the mask. Typically, the phototool includes the image on a polyester base that is 5 to 7 mils thick. The image-bearing transparency film is placed on the thermally removable layer the functions as a release layer, a vacuum is pulled to assure good contact of the mask film to the element, and the element is exposed. The image-bearing transparency film is removed from the element prior to thermal treating. Similarly, a template having at least actinic radiation blocking portions can be disposed above the photopolymerizable layer of the photosensitive element before the element is exposed. The template is removed from the element prior to thermal processing.

In use, the photosensitive element of the present invention is exposed to actinic radiation from suitable sources. The actinic radiation exposure time can vary from a few seconds to minutes, depending upon the intensity and spectral energy distribution of the radiation, its distance from the photosensitive element, the desired image resolution, and the nature and amount of the photopolymerizable composition. Exposure temperatures are preferably ambient or slightly higher, i.e., about 200 to about 35° C. Exposure is of sufficient duration to crosslink the exposed areas down to the support or to the back exposed layer. Imagewise exposure time is typically much longer than backflash exposure time, and ranges from a few to tens of minutes.

Actinic radiation sources encompass the ultraviolet and visible wavelength regions. The suitability of a particular actinic radiation source is governed by the photosensitivity of the initiator and the at least one monomer used in preparing the flexographic printing plates. The preferred photosensitivity of most common flexographic printing plates are in the UV and deep UV area of the spectrum, as they afford better room-light stability. Examples of suitable visible and UV sources include carbon arcs, mercury-vapor arcs, fluorescent lamps, electron flash units, electron beam units, lasers, and photographic flood lamps. The most suitable sources of UV radiation are the mercury vapor lamps, particularly the sun lamps. Examples of industry standard radiation sources include the Sylvania 350 Blacklight fluorescent lamp (FR48T12/350 VL/VHO/180, 115 w), and the Philips UV-A "TL"-series low-pressure mercury-vapor fluorescent lamps. Typically, a mercury vapor arc or a sunlamp can be used at a distance of about 1.5 to about 60 inches (about 3.8 to about 153 cm) from the photosensitive element. These radiation sources generally emit long-wave UV radiation between 310–400 nm. Flexographic printing plates sensitive to these particular UV sources use initiators that absorb between 310–400 nm, and a suitable photobleachable compound should be absorptive in at least a portion of the 310–400 nm spectral range.

Imagewise exposure of the photosensitive element to actinic radiation may be conducted in the presence or absence of atmospheric oxygen for photosensitive elements having an in situ mask. Atmospheric oxygen is eliminated when the exposure is conducted in a vacuum. The exposure may be conducted in a vacuum to minimize the effects of oxygen on the polymerization reactions occurring in that layer. And for photosensitive elements that are exposed through an image transparency, the exposure must be conducted in vacuum to assure good contact between the image transparency and the photosensitive element. The exposure may be conducted in the presence of atmospheric oxygen since the mask is formed in situ or applied imagewise with radiation opaque material on the photopolymerizable layer, there is no need for vacuum to assure intimate contact. In the process of preparing a digital flexographic printing plate or sleeve, the overall exposure step preferably is conducted without vacuum, i.e., while the photosensitive element is in the presence of atmospheric oxygen, and without any additional layers present on top of the in situ mask.

A step change in printing performance was observed for a photosensitive element having an in situ mask was exposed in the presence of atomospheric oxygen and thermally treated relative to a photosensitive element that was given a conventional analog exposure and thermally treated as shown in Example 1. Further, imagewise exposure in the presence of atmospheric oxygen for the photosensitive element provided improved processing latitude since fewer thermal cycles of heating and contacting with an absorbent material were needed to achieve the same relief depth and improved reverse depth as shown in Examples 1 and 12.

The process of the invention usually includes a back exposure or backflash step. This is a blanket exposure to actinic radiation through the support. It is used to create a layer of polymerized material, or a floor, on the support side of the photopolymerizable layer and to sensitize the photopolymerizable layer. The floor provides improved adhesion between the photopolymerizable layer and the support, helps highlight dot resolution and also establishes the depth of the plate relief. The backflash exposure can take place before, after or during the other imaging steps. It is preferred that it takes place after to the overall exposure to actinic radiation through the mask and prior to thermal treating. Any of the conventional radiation sources discussed above for the overall (imagewise) actinic radiation exposure step can be used for the backflash exposure step. Exposure time generally range from a few seconds up to a few minutes.

Following overall exposure to actinic radiation through the mask, the element is prepared for thermal development. If the mask is an image-bearing transparency film, i.e., phototool, or a template, the film or template is removed prior to treating the element. When digital methods were used to form the mask, the mask remains on the photosensitive element and is present during thermal treating.

The treating step removes at least the photopolymerizable layer in the areas which were not exposed to actinic radiation, i.e., the non-polymerized areas or uncured areas of the photopolymerizable layer. For photosensitive elements having a transparent thermally removable layer, i.e., release layer, surface modifying layer, or adhesion modifying layer, the thermal treating step shall also remove or substantially remove the thermally removable layer on the polymerized areas of the photopolymerizable layer from the photosensitive element. For photosensitive elements that the mask was formed digitally, the thermal treating step also removes the mask image (which had been exposed to actinic radiation) and the underlying unexposed areas of the photopolymerizable layer, as well as any other thermally removable layers which may be present.

The imagewise exposed photosensitive element is then ready for the next step of the present process which is thermally treating the exposed element to develop the relief image or pattern. Thermally treating the element includes heating the exposed photopolymerizable layer and the thermally removable layer at a temperature sufficient to cause the unexposed (uncured) portions of the element to soften or melt or flow, and contacting the layer to an absorbent surface to absorb the melt or flow portions. The polymerized areas of the photopolymerizable layer have a higher melting temperature than the unpolymerized areas and therefore do not melt, soften, or flow at the development temperatures. The term "melt" is used to describe the behavior of the unirradiated portions of the photopolymerizable elastomeric layer subjected to an elevated temperature that softens and reduces the viscosity to permit flow and absorption by the absorbent material. The material of the meltable portion of the photopolymerizable layer is usually a viscoelastic material which does not have a sharp transition between a solid and a liquid, so the process functions to absorb the heated composition layer at any temperature above some threshold for absorption in the absorbent material. A wide temperature range may be utilized to "melt" the composition layer for the purposes of this invention. Absorption may be slower at lower temperatures and faster at higher temperatures during successful operation of the process.

The thermal treating steps of heating the photopolymerizable layer and the thermally removable layer and contacting the layer/s with an absorbent material can be done at the same time, or in sequence provided that the uncured portions of the photopolymerizable layer are still soft or in a melt state when contacted with the absorbent material. The photopolymerizable layer and the thermally removable layer/s are heated by conduction, convection, radiation, or other heating methods to a temperature sufficient to effect melting of the uncured portions but not so high as to effect distortion of the cured portions of the layer. The photosensitive element is heated to a surface temperature above about 40° C.; preferably from about 40° C. to about 230° C. (104–446° F.), more preferably from about 100 to 200° C., and most preferably from 100 to 160° C. in order to effect melting or flowing of the uncured portions of the photopolymerizable layer and the thermally removable layer. The absorbent material contacts the surface of the heated photosensitive element, and absorbs the softened or molten or flowing portions of the elastomeric layer from the unirradiated portions, forming a flexographic printing plate in which the uncured portions are removed to form a relief pattern or surface. The thermally removable layer disposed above the photopolymerizable layer may soften or melt or flow and be absorbed as well by the absorbent material. The thermally removable layer disposed above the photopolymerizable layer may form microcracks as a result of the contacting with the absorbant material and thus may be carried by the softened or molten or flowing portions of the photopolymerizable layer to the absorbant material. By maintaining more or less intimate contact of the absorbent material with the photopolymerizable layer that is molten in the uncured regions and the thermally removable layer, a transfer of the uncured photosensitive material from the photopolymerizable layer to the absorbent material takes place. While still in the heated condition, the absorbent material is separated from the cured photopolymerizable layer in contact with the support layer to reveal the relief structure. A cycle of the steps of heating the photopolymerizable elastomeric layer and contacting the molten (portions) layer with an absorbent material can be repeated as many times as necessary to adequately remove the uncured material and create sufficient relief depth. However, it is desirable to minimize the number of cycles for suitable system performance, typically the photopolymerizable element is thermally treated for 5 to 15 cycles.

A preferred apparatus to thermally develop the photosensitive element is disclosed by Peterson et al. in U.S. Pat. No. 5,279,697, and also by Johnson et al. in Patent Cooperation Treaty Application No. PCT/US00/24400 filed Sep. 6, 2000 (IM-1289 PCT). The photosensitive element may be placed on a drum or a planar surface in order for thermal treatment to be carried out.

The absorbent material is selected having a melt temperature exceeding the melt temperature of the unirradiated or uncured portions of the radiation curable composition and having good tear resistance at the same operating temperatures. Preferably, the selected material withstands temperatures required to process the photosensitive element during heating. The absorbent material is selected from non-woven materials, paper stocks, fibrous woven material, open-celled foam materials, porous materials that contain more or less a substantial fraction of their included volume as void volume. The absorbent material can be in web or sheet form. Preferred absorbent materials utilized to remove or wick away the uncured portions of the photopolymerizable layer from the cured portions of the layer are selected from absorbent materials which possess internal strength and tear resistance to temperatures up to, including and slightly beyond the melting temperature of the uncured photopolymerizable material. The absorbent materials should also possess a high absorbency for the molten elastomeric composition as measured by the grams of elastomer that can be absorbed per square millimeter of the absorbent material. Preferred is a non-woven nylon web.

Intimate contact of the absorbent material to the photopolymerizable layer (while in the uncured portions are melt) may be maintained by the pressing the layer and the absorbent material together. It is desirable to apply a substantially uniform pressure of between about 2.11 kilograms per square centimeter and about 4.92 kilograms per square centimeter, with a preferred pressure of about 3.16 kilograms per square centimeter during processing. Pressure is applied to force the absorbent material into intimate contact with the photopolymerizable layer. It is believed that between about 0.70 kilograms per square centimeter and about 7.03 kilograms per square centimeter in a nip of the area in contact is adequate to enhance the absorption from the layer surface to the absorbent material without distorting the relief features on the photosensitive element. It is particularly preferred for photosensitive elements having a thermally removable layer (b) or (c) to apply pressure with contacting of the absorbant material. The application of pressure causes microcracks in the thermally removable layer/s to form which allow unpolymerized portions of the photopolymerizable layer to flow and carry away, i.e., remove, the materials of the thermally removable layer.

The photosensitive printing elements of the present invention can be uniformly post-exposed to ensure that the photopolymerization process is complete and that the element will remain stable during printing and storage. This post-exposure step can utilize the same radiation source as the main overall exposure.

Detackification is an optional post-development treatment that can be applied if the surface of the photosensitive printing element is still tacky, such tackiness not generally being removed in post-exposure. Tackiness can be eliminated by methods well known in the art, such as treatment with bromine or chlorine solutions. Preferably, detackification is accomplished by exposure to radiation sources having a wavelength not longer than 300 nm, as disclosed in European Published Patent Application 0 017927 and Gibson U.S. Pat. No. 4,806,506.

EXAMPLES

In the following examples, all percentages are by weight unless otherwise noted. CYREL® photopolymer printing plates, CYREL® exposure unit, CYREL® Fast 1000 TD processor, CYREL® Digital Imager, CYREL® OPTISOL® developing solution are all available from The DuPont Company (Wilmington, Del.).

Example 1

The following Example demonstrates the process of this invention of thermally treating a photosensitive element having a thermally removable layer which is actinic radiation opaque. The unexpected benefits in printing performance of the photosensitive element which is UV exposed in air and thermally processed are also shown.

Comparative and Control samples were prepared as follows. CYREL photopolymer plates, type HOS (67 mils)

were used. The plates included a photopolymerizable layer of a binder, at least one monomer, and photoinitiator, and a release layer of 80 wt. % of Macromelt® 6900 polyamide (from Henkel Corp.) and 20 wt. % of Amphomer® 28-4910 (a polymer from National Starch & Chemical Co. according to U.S. Pat. No. 3,927,199), and a coversheet. (The Macromelt polyamide binder has a softening point of 135° C. The melting point of the Amphomer binder is not available, but the glass transition temperature, Tg, is 0.120° C. Since the Tg for common polymers is typically 100 to 240° C. higher than the melting temperature as shown in data from *Polymer Handbook*, J. Brandup and F. H. Immergut, eds., Interscience, New York, 1966, it is estimated that the softening point for Material 2 is most likely at least 220° C.)

Three 67 HOS plates were given a back flash exposure of 12 seconds on a Kelleigh exposure unit. The coversheet was discarded. Three identical silver halide targets having 150 lines per inch screen ruling tonal range (2, 3, 4, 5, 10, 20, 30, 40, 50, 60, 70, 80, 90, 95, 96, 97, 98 & 99 dots, and solid), slur targets, and fine positive and negative lines images were used during the main UV imaging step. The targets (with the silver halide emulsion down) were laid on the release layer surface the photopolymer plate and the vacuum was pulled to its maximum value with Kreen coversheet (5 mils thick) on top. Plates were exposed for 9 minutes on the same 2001 exposure unit. After removing from the vacuum frame, they were processed differently.

Two exposed plates, Comparative 1A and 1B, were thermally treated in a thermal processor similar to the processor described by Peterson et al. in U.S. Pat. No. 5,279,697. The processor used for this example was modified to include an infrared (IR) heater with a maximum power of 5200W to heat an outer surface of the plate. The processor further included cooling with air of the plate after separation of an absorbent material from the photopolymerizable layer. The absorbent material was CEREX non-woven nylon web type 2320. For this test, the IR heater was run at 30% of its maximum output, with drum speed of 30 inch/min (76.2 cm/minute). The temperature of the developer roll was 300° F. (148.9° C.). The temperature of the drum was set at 70° F. The pressure associated with contacting the plates to the absorbent material (drum to developer roll) was 30 psi on the cylinders. The cooling blower was on.

Plate samples for Comparatives 1A and 1B were processed for 6 cycles and 12 cycles of heating and contacting (with the absorbant material) respectively. The exposed plates were placed and clamped to the drum and rotated by the drum through multiple cycles of heating the photopolymerizable layer, contacting the layer with a web of an absorbent material, separating the absorbent material from the layer, and cooling the layer. It took 3 thermal cycles to completely remove the release layer in the exposed plate surfaces. Processed plates were light finished and post-exposed same time for 10 minutes each. The relief depth and the depth of the reverse line of a 31.5 mil negative line (reverse depth) were measured for each Comparative and reported below.

The remaining exposed plate, Control 1, was solvent washed in an imine CYREL 1001P solvent processor with OPTISOL solvent. It was dried in 60° C. oven for 1.5 hours, and then light finished and post-exposed the same time for 10 minutes each. Control 1 had a relief depth of 41 mils. The measurement of the reverse line (31.5 mils negative line) showed a reverse depth of 600 micron.

The plate used for Example 1 was a CYREL photopolymer plate, type DPH (67 mils). The composition of the photopolymerizable layer of the DPH plate was the same as the photopolymerizable layer for the HOS that was used for the Comparatives and Control samples. The DPH plate included the photopolymerizable layer, an infrared-sensitive, a laser ablatable (i.e., actinic radiation opaque) layer, and a coversheet. The actinic radiation opaque layer included 67 wt. % of Macromelt® 6900 polyamide as a binder and 33 wt. % of carbon black. The Macromelt polyamide binder has a softening point of 135° C.

The sample plate for Example 1 was backflashed for 12 seconds on the Kelleigh exposure unit. After discarding the coversheet, the plate was mounted on the drum of the CYREL Digital Imager with the actinic radiation opaque layer facing out, and the plate was held tight with vacuum on the drum and with tapes on all sides. Artwork images equivalent to the silver halide targets as described for the Comparatives and Control were laser ablated onto the radiation opaque layer using Nd:YAG laser (light wavelength output at 1064 nm). Excellent in situ mask on plate was obtained with the laser ablation energy of 3.2 Jules/cm$^2$. The actinic radiation opaque layer of Example 1 had the visual transmission density of 2.95, and the ablated solid had a stain density of 0.10 (transmission). The ablated plate was given a main UV exposure in the open air (under atmospheric oxygen) for 9 minutes on the CYREL 2001 exposure unit.

The resulting plate was thermally treated using the same thermal processor and the same processing conditions as described above for the Comparative Examples 1A and 1B except that the plate of Example 1 was thermally treated for 6 thermal cycles of heating and contacting with the absorbent material. The UV exposed black mask images were completely removed after first thermal cycle. Surprisingly, even though the infrared-sensitive layer contains carbon black, an unmeltable compound, the remaining portions of the layer were completely removed during thermal development. The plate was light finished and post-exposed for 10 minutes at the same time.

The relief depth and the reverse depth for Example 1 was measured and reported below.

| Example | Relief Depth (mil) | Reverse Depth (micron) |
|---|---|---|
| Comparative 1A | 22 | 231 |
| Comparative 1B | 33 | 260 |
| Control 1 | 41 | 600 |
| Example 1 | 21.8 | 380 |

Example 1 showed a dramatic improvement in reverse depth with equivalent relief depth when compared to Comparative 1A. It was surprising that given the same thermal processing conditions, the exposure conditions of laser ablation to form the mask and exposure in open air of Example 1 provided such a dramatic improvement over that of the analog exposed Comparative 1A with a silver halide target under the vacuum pull.

The reverse depth (for a 31.5 mil negative line) of Example 1 was much deeper than the reverse depth of Comparative 1A and 1B processed for 6 or 12 thermal cycles. However, the thermally treated plates of Example 1 and Comparatives 1A and 1B gave lower relief depth and lower reverse depth than that of solvent processed plate of Control 1, even though all samples were given the same backflash and main UV exposure levels.

The plates of Example 1, Comparative 1A and 1B and the Control were printed on a Mark Andy Press System 830

(Chesterfield, Mo.). Film III Dense Black EC8630 ink (Environment Inks & Coatings, Morgantown, N.C.) was diluted with EIC Aqua Refresh EC1296 (with a mixture of two solvents) to give a viscosity of 27 seconds as measured using a Zahn #2 cup. Printing was done on Hi-Gloss 40FS S246 paper (Fasson, Painsville, Ohio), at 100 feet/minute.

The plate of Example 1 which was UV exposed in atmospheric air through the mask had excellent print quality of the whole tonal scale, excellent print of slur targets and excellent solid printing. It was surprising and unexpected to find that the thermal treated plates of Comparative 1A and 1B gave significantly poorer printing performances than that of the solvent treated plate, Control 1. Dirty printing of dots from mid-tone to shadow areas (40–99%), dirty slur target printing, and patchy (uneven) solid printing were observed for the Comparatives 1A and 1B while the Control 1 gave good and sharp printing results for both the tonal range scale and slur targets. This showed that the processing method has dramatic effect on how the unexposed areas are being removed effectively between the dots and fine reverses as well as how the exposed release layer is being removed from the exposed plate surface, and thus on the final printing performance difference. Thermal processing is much less effective in removing the unexposed photopolymer areas and the exposed release layer on the plate surface than the solvent processing (with a mixture of two solvents) under the brush, and thus much poor printing quality.

It was unexpected to find that the plate of Example 1 (exposed thru in situ mask in the open air with no additional layers on the plate sample) had dramatically improved printing performance when compared to the plate of Comparative 1A (analog exposure through target film under vacuum with Kreen coversheet on top). This was particularly surprising since the plate of both Example 1 and Comparative 1A were thermally treated for 6 cycles and given the same levels of backflash and imaging exposures. It was also very surprising to find that the 70% nominal dots (60.4% measured) of Example 1 gave much cleaner printing than that of 50% nominal dots of Comparative IA (52.7% measured). This showed that UV exposure conditions play an extremely important role for plates that are thermally processed to form the relief.

Example 2

The following example demonstrates process of this invention using photosensitive elements each having a thermally removable layer and one or more additional layers above the photopolymerizable layer.

For Controls A and B, each top layer was coated from a 4% solid solution on a temporary substrate (Mylar® polyester 5 mils thick) to form a continuous coating with minimum of surfactant present as the coating aid. After the coating was allowed to dry (at least overnight for room dried coatings), the temporary substrate with the dried coating was hot laminated to a photopolymerizable layer. For all samples except Example 2A and 2C, the photopolymerizable layer was from a CYREL photopolymer printing plate, type UXL, 67 mils thick. The coversheet and release layer were removed prior to lamination for all samples in which the photopolymerizable layer originated from a CYREL printing plate. The coating and temporary substrate was laminated such that the top layer was disposed above the surface of the photopolymerizable layer opposite the support.

For Example 2A, a plate structure was assembled as follows. A CYREL photopolymer plate, type AQS, (67 mils) having the release layer removed was used as the photopolymerizable layer. A second element having multiple layers including a radiation opaque layer was laminated to the photopolymerizable layer of the AQS plate. The second element was prepared and included in the following order an adhesion modifying layer of 90 parts Macromelt 6900 polyamide and 10 parts copolymer of vinylpyrrolidone and vinyl acetate (60/40 ratio) (PVP-VA-630) having a coating weight of 3.0 mg/dm$^2$; a radiation opaque layer of 16.9 grams of BS-11548 carbon black pigmented dispersion (from CDI Dispersions) (see Ex. 8) and 2.80 grams of Polyox WSRN polyethylene oxide, the layer having a density of 3.0; and an overcoat layer of 100% solution of Polyox WSRN polyethylene oxide having a coating weight of 40 mg/dm$^2$, on a temporary MYLAR polyester support. The plate structure was the temporary MYLAR support as a coversheet, the adhesion modifying layer, the radiation opaque layer, the overcoat layer as a barrier layer, and the AQS photopolymerizable layer on a permanent support.

For Example 2B, a separate element was prepared by coating onto a temporary support a radiation opaque layer of 33 wt. % carbon black and 67% Macromelt polyamide (dried coating weight of 26 mg/dm2), and then a layer of polyethylene wax (coating weight of 8 mg/dm2). The separate element was laminated to the UXL photopolymerizable layer such that the photosensitive element had the following structure, a coversheet of the temporary support, the radiation opaque layer, the wax layer, UXL photopolymerizable layer on a permanent support.

For Example 2C, a plate structure was assembled as follows. A CYREL photopolymer plate, type HCS, (67 mils) having the release layer removed was used as the photopolymerizable layer. A second element was prepared by coating onto a temporary support a radiation opaque layer of 33 wt. % carbon black and 67% Macromelt polyamide (dried coating weight of 15 mg/dm2); and then a layer of a copolymer of vinylpyrrolidone and vinyl acetate, (PVP-VA-W735 from International Specialty products), (20 mg/dm2 coating weight). The second element was laminated to the HCS photopolymerizable layer such that the photosensitive element had the following structure, a coversheet of the temporary support, the radiation opaque layer, the PVP-VA layer, HCS photopolymerizable layer on a permanent support.

| Name | Description | Softening Point (or Other) |
| --- | --- | --- |
| Macromelt ® 6900 | Polyamide from Henkel Corporation, Polymer Division | 135° C. |
| PVP-VA W735 | Copolymer of vinylpyrrolidone and vinyl acetate from International Specialty Products | 141° C. |
| PVP-VA-630 | Copolymer of vinylpyrrolidone and vinyl acetate (60 and 40 ratio) from International Specialty Products | Not available |
| Polyox WSRN-750 | Polyethylene oxide from Union Carbide | 65° C. (melt point) |
| Polyethylene wax | | <100° C. (melt pt.) |

Each element was backflash exposed for 15 seconds on the CYREL 2001 exposure unit. The temporary coversheet was removed. Half of each element was given an overall exposure of 9 minutes to ultraviolet radiation through the thermally removable layer side on the exposure unit in the open air, while the other half of the element was covered with a film which blocked UV light. (There was no imagewise exposure of the element.) This allowed one to observe the thermal processability of the element both in the unexposed state and UV exposed state. Elements were thermally processed in a CYREL Fast 1000 TD processor at the processing conditions below.

The cycles required to remove the thermally removable layer were noted and a maximum of 12 thermal cycles of heating and contacting was given for each element. The relief depth after 12 thermal cycles was measured. The elements were assessed for the performance of the material as a thermally removable layer. A satisfactory thermally removable layer on the thermally processed element, is one in which the thermally removable layer is removed with minimal thermal cycles from at least the unexposed areas of the underlying photopolymer layer, and also allows effective removal of the unexposed photopolymer layer. In some cases, it is necessary for the thermally removable layer in the exposed areas of the photopolymerizable layer to also be removed during thermal treatment. (Minimal thermal cycles are preferably less than 12 cycles of heating and contacting the element with an absorbant material.) If there is residual material from the top layer on the exposed photopolymer surface, the residual material should not interfere with the ultimate printing performance of the plate and thus should provide good and even printing surfaces.

The processing conditions for the thermal were set as follows:

| | |
|---|---|
| Developer roll temperature: | 275° F. |
| Drum temperature: | 95° F. |
| Pressure: | 2.2 psi/inch |
| Plate speed: | 30 inches/minute |
| IR setting: | 80% of maximum |
| Relief setting: | 20 mils |
| Blower: | automatic |

All elements were given first a heating cycle and followed by heating and contacting cycles up to 12 cycles of heating and contacting with an absorbent web, CEREX® non-woven nylon.

Table 1 lists the material used for the thermally removable (T.R.) layer, the total coating weight of the layers on the photopolymerizable layer including the thermally removable layer/s, the number of thermal cycles required to remove the exposed and unexposed T.R. layer, the relief depth of the photopolymer layer after 12 cycles of heating and contacting with the absorbent material, and the overall assessment of the thermally removable layer in thermal processing.

The results of Example 2 show that the thermally removable layer as well as multiple additional layers on the photopolymerizable layer can be removed by thermal processing. Further, the top layer can be thermally removed even when the top layer contains carbon black, a material that is non-meltable, with a binder which is softenable or meltable at the thermal treating temperature. The melting or softening point of the binder material forming one or more additional layers on the photopolymerizable material should be less than the temperature for thermal treating the element. While it is preferred to have the lower melting or softening temperature of the binder in the thermally removable layer and the one or more additional layers, the melting or softening temperature is not the only factor to be considered. For instance, compatability or incompatibility of the binder material in the thermally removable layer or the one or more additional layers with the migratory materials (e.g., monomer and photoinitiator) in the photopolymerizable layer when adjacent the photopolymerizable must be considered. If the binder in the layer adjacent the photopolymerizable layer is compatible with the migratory materials in the photopolymerizable layer, the thermal processability of the top layer may be detrimentally affected.

Example 3

The following example demonstrates the process of this invention in which the physical form of the organic binder used in the thermally removable layer has an important effect on thermal processability of a photopolymer plate.

Similar to Example 2, each top layer for the Comparative Examples was coated from a 4% solid solution on a temporary substrate (Mylar® polyester 5 mils thick) to form a continuous coating with minimum of surfactant present as the coating aid. After the coating was allowed to dry (at least overnight for room dried coatings), the temporary substrate with the dried coating was hot laminated to a photopolymerizable layer. For all samples in this Example, the photopolymerizable layer was from a CYREL photopolymer printing plate, type UXL, 67 mils thick, in which the coversheet and release layer were removed prior to lamination. The coating with the temporary substrate was laminated to the photopolymerizable layer such that the top layer was disposed above the surface of the photopolymerizable layer opposite the support.

For Examples A and 3B, each of the Elvanol compounds were separately applied as a powder onto the tacky photopolymerizable surface of a UXL plate (having release layer removed). Elvanol 75-15, a fully hydrolyzed (99%) polyvi-

TABLE 1

| Example | Material for T.R. Layer | Ctg. Wt. (mg/dm²) | Cycles needed to remove T.R. layer Exposed | Cycles needed to remove T.R. layer Unexposed | Relief (mils) Unexp. | Assessment |
|---|---|---|---|---|---|---|
| Control A | Macromelt 6900 | 42 | 1 | 1 | 19.5 | Excellent |
| Control B | PVP-VA-630 | 11.8 | 2 | 1 | 21.2 | Good |
| 2A | Multilayer: T.R.L. of polyethylene oxide and carbon black | 58 | 1 | 1 | 32 | Excellent |
| 2B | Multilayer: T.R.L. of polyamide and carbon black | 34 | 1 | 1 | 25.5 | Excellent |
| 2C | Multilayer: T.R.L. of polyamide and carbon black | 35 | 1 | 1 | good relief | Excellent | nyl alcohol, and Elvanol 50-42, a 88% hydrolyzed polyvinyl alcohol (12% vinyl acetate), were supplied by the vendor, DuPont, in powder form.

| Name | Description | Softening Point (or Other) |
|---|---|---|
| Elvanol 75-15 | Fully hydrolyzed (99%) polyvinyl alcohol from DuPont Co. | Not softenable, degrades at 200° C. |
| Elvanol 50-42 | 88% hydrolyzed polyvinyl alcohol (12% vinyl acetate) from DuPont Co. | Not softenable, degrades at 200° C. |
| Klucel G | Hydroxypropyl cellulose from Aqualon (molecular wt. 370,000) | 130° C. |
| Klucel E | Hydroxypropyl cellulose from Aqualon (molecular wt. 80,000) | 100° C. |

The release layer of a 67 UXL plate was removed with tape to provide the photopolymerizable layer with a tacky surface, and Elvanol 75-15 was applied as a powder by pad toning for 20 cycles, creating plate sample Example 3A. Loose powders were wiped off from the plate surface with a LasStik cloth. A second UXL plate was similarly toned with Elvanol 50-42 powder, creating plate sample Example 3B. In both cases, the toned UXL plate surface became tack-free, which showed that Elvanol powders were indeed on the plate surface as desired. Both plates were given a backflash exposure of 15 econds on CYREL 2001 exposure unit.

The resulting two plates, Examples A and 3B, were thermally treated on the CYREL Fast 1000 TD machine under the same conditions as described in Example 2. It was surprising to find that both polyvinyl alcohol compounds in powder form were completely removed from the unexposed photopolymer plate surfaces after one cycle of heating (the plate) and contacting (the plate surface) with the absorbent material. The relief depths for both plates of Example 3A and 3B were 26 mils after 12 cycles of heating and contacting with absorbent material.

element including the removal of the unexposed photopolymerizable areas. However, the results of Examples 3A and 3B showed that when organic binder is used in the powder form (or as particulates), on the surface of the photopolymerizable layer, the softening or melting point of the binder is no longer a limitation for thermal removal of the layer formed of particulates together with the underlying unexposed photopolymerizable areas. Comparative Examples 3C and 3D each had a continuous film coating of a hydroxypropyl cellulose material as the top layer on the photopolymerizable layer.

The use of hydroxypropyl cellulose as a release layer on a photopolymerizable layer was disclosed by Wang in EP 0 665 471 A2 (see Examples 3, 4, Comp. 3, and Comp. 4). The top layer coating of Comparative Example 3C was not usable because the exposed areas of the top layer remained on the polymerized plate surface as uneven strings and those strings gave poor printing results. The top layer coating of Comparative Example 3D gave fair results because the exposed areas required longer thermal cycles to remove the top layer. The results are fairly consistent with those shown by Wang. Softening/melting point of a material forming a continuous coating on the photopolymerizable layer plays a role in thermal processability. Lower softening temperature is preferred for thermal processing of plates.

Other high softening or melting organic powders were also applied to the tacky surface of the photopolymerizable layer of a UXL plate and tested following the same test method as described above in this Example for polyvinyl alcohol powders. The materials used were cellulose acetate powder (melt point of 230° C.) and cellulose acetate butyrate (melt point of 155° C.) (both from Eastman Kodak). Only one thermal cycle of heating and contacting absorbent material was required to remove the unexposed powder and good relief depth of 27 mils was obtained after 12 cycles of heating and contacting absorbent layer.

Results showed that the physical form of the organic binder used in the thermally removable layer has an important effect on thermal processability of the photosensitive element.

| Ex. | Material for T.R. Layer | Ctg. Wt. (mg/dm²) | Cycles needed to remove T.R. layer Exposed | Cycles needed to remove T.R. layer Unexposed | Relief (mils) Unexp. | Assessment |
|---|---|---|---|---|---|---|
| Comp 3A | Elvanol 75-15 (film form ctg.) | 11.76 | >>12 not removable | >>12 not removed | zero | Not good |
| Comp 3B | Elvanol 50-42 (film form ctg.) | 11.44 | >>12 not removable | >>12 not removed | zero | Not good |
| Comp 3C | Klucel G (film form ctg.) | 21.89 | >>2 not removable | Removed in 1 cycle but as strings | 21 | Not good |
| Comp 3D | Klucel E (film form ctg.) | 6.64 | 7 | 1 | 29 | Fair |
| 3A | Elvanol 75-15 (powder) | — | 1 | 1 | 26 | Excellent |
| 3B | Elvanol 50-42 (powder) | — | 1 | 1 | 26 | Excellent |

Surprisingly, the results of Examples 3A and 3B are completely different from that observed in Comparative Examples 3A and 3B where no relief depth was obtained for Elvanol 75-15 and Elvanol 50–52 as a continuous film on the same photopolymer plate even in the unexposed areas. Both Elvanol 75-15 and Elvanol 50-42 are not softenable and degrade at about 200° C. When used as a binder in a continuous film-forming layer as in Comparatives Examples 3A and 3B, the melting or softening point of the binder in a top layer can influence the thermal developability of the Example 4

The following example demonstrates the process of this invention in which a layer of particluate material is the thermally removable layer on the photopolymerizable layer. The particulate material forms a radiation opaque layer.

Similar to Example 3, a CYREL photopolymer plate, type UXL (67 mil) was prepared (i.e., release layer and coversheet removed) for application of different black powder materials. Carbon black is a non-meltable compound. The black particulate material was applied to achieve black transmission density of at least 2.00 (visual filter). Loose powders were wiped off with Lastic cloth. In Example 4A, Cromalin® black toner KK6-CN (available from DuPont Co.) which comprises carbon black and cellulose acetate (melt point 230° C.) was used and the density of the toned layer on the plate was 2.98. In Example 4B, a black electrostatic toner (from Lanier) which comprises carbon black and styrene acrylate polymer was used and the density of the toned layer on the plate was 2.63. The particle size measurement was conducted on a Coulter® Multisizer instrument. Particle size was reported as equivalent spherical diameter in microns and the volume distributions at 10%, 50%, and 90% (in microns) are as follows for each of the toners.

| Material | d10 | d50 | d90 |
| --- | --- | --- | --- |
| KK6-CN | 4.29 | 7.51 | 18.20 |
| Electrostatic Toner | 6.91 | 10.72 | 15.38 |

For Example 4C, a different CYREL photopolymer plate, type EXL, (67 mil) was prepared similar to Example 3 and toned with the KK6-CN powder. Type EXL plate includes on the photopolymerizable layer an elastomeric capping layer which has a blue color. The density of the black toner layer was 2.08.

All plates of Examples 4A–4C, were given a backflash exposure of 15 seconds on CYREL 2001 Exposure unit and then overall exposed to UV radiation through the black particulates side in the open air (in the presence of atmosphere oxygen) for 9 minutes. That is, no imagewise exposure was given to the element. This overall exposure simulated the exposure conditions experienced by opaque areas of an in situ mask on an element having an infrared sensitive layer. Thus the UV exposed black particulates that can form an in situ mask must also be thermally removable, together with the underneath photopolymer layer to give desired relief depth.

All plates of Examples 4A–4C were thermally treated in the CYREL Fast 1000TD thermal processor under the same processing conditions as described in Example 2. Surprisingly, only one cycle of heating (the plate) and contacting the absorbent (to the outermost surface of the plate) was required to remove the layer of black particulates for Example 4B with the underlying photopolymer layer. Only two cycles were needed to remove the layer of black particulates for Examples 4A and 4C with the underlying UXL and EXL photopolymer layers respectively. Good deep relief depth was obtained for all three plates after 12 cycles of heating and contacting the absorbent material.

| Example | Relief Depth (mils) |
| --- | --- |
| 4A | 35 mils |
| 4B | 26 mils |
| 4C | 27 mils |

The results demonstrated that excellent thermal removal of radiation opaque particulates on photopolymer plate surface with the underlying (unpolymerized) photopolymer layer and in situ UV mask property can be achieved as desired.

Example 4D

For Example 4D, another UXL plate with the KK6-CN black particulate as described above in Example 4 was prepared similar to Example 4A, but density of the black toner layer was 2.24 on the plate. The plate of Example 4D was given the backflash exposure of 20 seconds in the Kelleigh Exposure unit, and then placed on a drum of the CYREL Digital Imager as described in Example 1. The black particulate layer was laser ablated at 2.4 Joules/cm² using the same images as in Example 1. Excellent ablated images were obtained and the ablated solid had a stain density of 0.08 transmission density. The laser ablation step formed an in situ mask on the photopolymerizable layer. The laser-ablated plate was then UV exposed through the in situ mask side in the open air for 10 minutes on the Kelleigh Exposure unit. The plate was thermally processed in the CYREL Fast 1000TD with the same processing conditions as in Example 2. Only two cycles of heating and contacting with absorbent material were needed to remove the black particulate layer with the underlying photopolymer layer. The relief depth after 12 cycles of heating and contacting the absorbent material was 23 mils. There were no residual black toner particulates on the floor nor in the fine reverses of the relief imaged plate. After post-exposure and finishing, the plate was used for printing on a Mark Andy press with conditions and materials as described in Example 1. The plate of Example 4D gave excellent processed images and excellent print quality for the whole tonal range, slur targets and solid as desired.

Example 5

The following example demonstrates the process of this invention in which layer of inorganic particulates is the thermally removable layer on the photopolymerizable layer. The inorganic particulates have a melting point well above the thermal treating temperature used to melt, soften or remove the unpolymerized areas of the photopolymerizable layer.

Similar to Examples 3 and 4, a layer of a particulate material was applied by toning to the tacky surface of a photopolymerizable layer of a CYREL photopolymer plate, type UXL (67 mils) having the release layer removed. For Example 5A, aluminum silicate (sold as Satin White from Englehard) (melt point 1000° C.) was used. The particle size measurement was conducted on a Coulter® Multisizer instrument. Particle size was reported as equivalent spherical diameter in microns and the volume distributions at 10%, 50%, and 90% (in microns) are as follows.

| | d10 | d50 | d90 |
| --- | --- | --- | --- |
| Satin White | 3.16 | 6.73 | 13.67 |

The excess powder was wiped off with LasStik cloth. The surface of the plate having the particulate layer was tack-free.

The plate of Example 5A was given backflash exposure of 15 seconds on CYREL 2001 exposure unit. The plate was thermally treated on the CYREL Fast 1000 TD machine under the same processing conditions as in Example 2. Surprisingly, only one thermal cycle was required to remove the (unexposed) particulates of Example 5A from the plate surface. For Example 5A, the relief depth was 20 mils after 12 cycles of heating and contacting with absorbent material.

Similar good results were also obtained for particulate material of titanium dioxide (melt point of 1560° C.) toned on the photopolymerizable layer. The toned particulate material provided the element with a tack-free surface and was removed in the first thermal cycle during thermal treating.

Example 6

The following Example demonstrates the importance of the size of particulates forming a thermally removable layer on the photopolymerizable layer in the process of this invention. The thermally removable layer is formed of metal and metal alloy particulates having a high melting point. By proper selection of particle size, the metallic particulates can be used to form in situ mask and be removed thermally with the unpolymerized areas of the photopolymerizable layer.

Similar to Examples 3 and 4, a layer of a particulate material was applied by toning to the tacky surface of a photopolymerizable layer of a CYREL photopolymer plate, type UXL (67 mils) at room temperature. To ensure good coverage of these particulates for in situ mask application, plates were toned twice (40 toning cycles each time). Loose particulates were wipe off with LasStik cloth.

For Example 6A, the particulate layer was formed of MS-1, aluminum flakes (melt point 660° C.) having less than 5% stearic acid (obtained from Alcan Toyo America). The reported average particle size (By Microtrac) was 32 micron. For Examples 6B and 6C, the particulate layer was formed of XB-260 Pale and Resist CT Pale metal alloys (obtained from Eckart America L. P.), respectively. According to Material Safety Data Sheets supplied by Eckart, XB-260 Pale comprises of 85–95% copper, 5–15% zinc, and 0.2–2.0% stearic acid, with a reported average particle size of 5 micron (Cilas method), and, Resist CT Pale comprises 68–88% copper, 9–29% zinc and 3% SiO2 with a reported average particle size of 35 um (Cilas method). The particle size of the particulate was also measured in our lab. Particle size measurement was conducted on a Coulter® Multisizer instrument. Particle size was reported as equivalent spherical diameter in microns and the volume distribution results (in microns) are as follows.

| Particulate | D10 | d50 | d90 |
|---|---|---|---|
| MS-1 | 12.8 | 27.14 | 41.05 |
| XB-260 | 2.46 | 3.95 | 21.63 |
| Resist CT Pale | 7.88 | 18.32 | 24.63 |

The d50 is the median wherein half of the sample's mass consists of particles smaller than the given diameter in microns. The d90 means that 90% of the sample's mass consists of particles smaller than the given diameter in microns. For particluate to be used as a radiation opaque mask, the volume distributions at d50 and d90 should be considered.

The transmission density (with visual filter) of Examples 6A, 6B, and 6C on the plate was 1.15, 2.07 and 1.02, respectively. All toned plate surfaces were tack-free. It was surprising that the particulates of Example 6B (XB-260) which had the smallest average particle size among three metallic particulates, provided the highest transmission density under the same toning conditions.

All plates of Examples 6A–6C were given a backflash exposure of 20 seconds in the Kelleigh exposure unit. The plates were laser ablated to imagewise remove the particulate layer on the CYREL Digital Imager with a Nd:YAG laser emitted at about 1064 nm with the same image file as in Example 1, and form a mask. All three plates had good ablated images. The optimum laser ablation energy was determined to be 5.9, 3.2 and 5.9 Joules/cm$^2$ for Example 6A, 6B, and 6C respectively. The ablated solid area had a transmission density of 0.07, 0.37 and 0.16 for Example 6A, 6B, and 6C, respectively. Big metallic particles were observed on the ablated surface of the photopolymerizable layer for plates of Example 6A and 6C. Gray residue was observed on the ablated surface of the photopolymerizable layer for the plates of Example 6B. All the plates that had been ablated were UV exposed in the open air through the metal and metal alloy (mask) side for 9 minutes on CYREL 2001 exposure unit.

All plates were then thermally processed on the same thermal processor and with the same conditions as described in Example 2 for 12 cycles of heating and contacting with the absorbent material.

After 12 cycles of heating and contacting with the absorbent material, the plate of Example 6C had extremely low relief depth (2.5 mils) and there were lots of the metallic particulates remaining in the floor and in the fine reverses (more than on the ablated area surface). Also there were residual particles on top of the surface of the plate of Example 6C to the extent that the transmission density in these areas was 0.10. Similar results were obtained for the plate of Example 6A. Surprisingly, the plate of Example 6B had good relief of 17 mils after 12 cycles of heating and contacting absorbent and all the particulates were removed with the underlying photopolymerizable layer in 2 cycles of heating and contacting with the absorbent material. The floor areas and the fine reverses were free of the metallic particulates. After post-exposure and light finishing for 10 minutes (which was conducted at the same time), all the plates were printed on Mark Andy press as described in Example 1. Very good printed images were obtained for the plate of Example 6B but poor printing was encountered for plates of Example 6A and 6C. Poor printing was the result of the low floor relief of the processed plate. Due to the size of the particles for the particulate material of Examples 6A and 6C were Comparative Examples to the invention demonstrated in Example 6B. It is believed that satisfactory results can be obtained with the particulate material of Comparative Examples 6A and 6C if the particulate material would be ground to the desired size, i.e., less than 23 microns.

Low relief depth of (Comparative) Examples 6A and 6C could be explained by the fact that these plates had low density (low UV blocking capability), and photopolymerization of the underneath photopolymerizable areas took place during UV exposure through the particulates. In order to provide a functional UV in situ mask, the toned metallic particulates must have transmission density greater than 2.0. A higher toned density of particulates represents a higher degree of packing of the particles on the plate surface. This was better achieved with particulates having smaller particle size volume distribution at d50 and d90 as was demonstrated in this Example. Smaller particulate size of the thermally removable layer was also useful in the thermal processing step. The smaller particles were more easily removed from the fine reverses and between dot areas of the plate surface. The particulate having large size tended to remain on the plate surface and in the fine reverses after thermal processing, and detrimentally affected printing performance.

This example also demonstrated the unexpected advantage of single processing step (thermal treatment only) is possible with a photopolymerizable element having a layer of metallic particulate. No additional aqueous potassium hydroxide solution was required to remove the metallic mask (by vacuum deposition) before the solvent developer step to remove the uncrosslinked diazo layer as described in the Example 1 of U.S. Pat. No. 4,132,168. This also gives improved overall turnaround time.

Example 7

The following example demonstrates an element and the process of this invention in which a coating of an inorganic dispersion of a filler agent and a binder form the thermally removable layer on the photopolymerizable layer.

Two stock solutions were made. Elvanol® 50-42, a 88% hydrolyzed polyvinylalcohol (12% vinyl acetate), was dissolved in distilled water to give 4% solution. Ludox® AM, a 30% solid of collodial silica (from DuPont Co.) was diluted with distilled water to give 4% solution. The average particle diameter of colloidal silica is 12 nanometers. A very small amount of Silwet surfactant was added to both solutions. Dried silica has a melting point of 1900° C. The dried particles of colloidal silica are chemically inert and heat resistant.

Two composite solutions were made from the 4% stock solutions and each was coated on 5 mil Mylar® polyester film with 2 mil doctor knife. The final dried coating compositions were 70% silica/30% Elvanol 50-42 by weight for Example 7A and 85% silica/15% Elvanol 50-42 for Example 7B. Each of the coatings for Examples 7A and 7B was a composite coating since the organic binder is in the discontinuous phase (that is the binder is less than 49% by weight of the total composition). For Example 7C, a third coating of only the silica stock solution was also made under the same conditions.

The coatings were dried at least for overnight room temperature and then were each coating was hot laminated to the photopolymerizable layer of a CYREL photopolymer plate, type UXL, (67 mil). The release layer of the plate was removed prior to lamination of the coating. Each sample was backflashed for 15 seconds in the CYREL 2001 exposure unit. The temporary MYLAR sheet was removed from the samples. Correct adhesion balance was obtained for all samples and the coatings adhered to the tacky photopolymer surface to give tack-free surface as desired.

The samples of Examples 7A-7C were thermally processed in the same thermal processor under the same conditions as described in Example 2.

Surprisingly, for Example 7B and Example 7C only one thermal cycle of heating and contacting with an absorbent material was necessary for the coating (i.e., thermally removable layer) to be removed with the unexposed photopolymerizable layer. For Example 7A, the coating was removed with the unexposed photopolymerizable layer in two thermal cycles. The relief depth after 12 cycles of heating and contacting with the absorbent material was 17 mils for Example 7A, 29 mils for Example 7B and 20 mils for Example 7C.

Comparatively, the continuous film made from Elvanol 50-42 (also from 4% solid solution and 2 mil knife coating) could not be used as the thermally removable layer for a photopolymer plate when thermally processed as described and shown in Example 3 (Comparative Example 3B). No relief depth was obtained in the unexposed areas of the plate even after 12 cycles of heating and contacting absorbent material.

This Example showed that it is possible to use as the thermally removable layer an extremely high melting inorganic material, e.g., silica having a melting point of 1900° C., as a filler, as well as an organic binder having a high melting point, such as polyvinyl alcohol which degrades at 200° C., to form a composite layer on the photopolymerizable layer, and yet, the photosensitive element will thermally process suitably. This demonstrated that softening and/or melting point limitations are not applicable to a photosensitive element having a thermally removable layer with less than 49 wt. % binder.

Example 8

The following example demonstrates the element and the process of this invention in which the thermally removable layer (b) is an actinic radiation opaque layer. The radiation opaque layer is based on carbon black dispersions or mixtures of carbon black dispersion and organic binder. Such coatings, after application to the photopolymer plate surface, can be digitally imaged and thermal processed.

Several coating solutions were prepared. BS11548 & BS15870 are carbon black pigmented aqueous dispersions from CDI Dispersions. BS 11548 dispersion has a total % solid of 51% that comprises 45% pigment and 6% of proprietary material. BS 15870 dispersion has a 46% total solid that comprises 38% pigment and 8% proprietary material. Each dispersion was diluted to 4% solution with distilled water, and small amount of surfactant (Zonyl FSN) was added. The diluted solutions were coated onto 5 mil Mylar® temporary supports with 2 mil doctor knife. The transmission density of the resulting dry coatings was 3.7 and 3.1 for BS 11548 (Coating A) and BS 15870 (Coating B), respectively.

Four more coating solutions were prepared by mixing the 4% Elvanol 50-42 (a 88% hydrolyzed polyvinyl alcohol (12% vinyl acetate)) stock solution (from Example 7) and the 4% BS 11548 dispersion so that the dried compositions were as follows. (Elvanol 50-42 is not softenable and degrades at 200° C.) Each of the dispersions was coated on 5 mil MYLAR polyester film using a 2 mil doctor knife, forming Coatings C, D, E, and G.

| Coating | Weight % Carbon Black | Weight % Elvanol 50-42 | Weight % Other proprietary material | Transmission Density (visual filter) | % binder per total binder + carbon black filler) |
|---|---|---|---|---|---|
| A | 88.2 | — | 11.8 | 3.7 | 0 |
| B | 82.8 | — | 17.2 | 3.1 | 0 |
| C | 49 | 44 | 7 | 2.8 | 47.3 |
| D | 70.3 | 20.5 | 9.2 | 3.4 | 22.8 |
| E | 83.8 | 5 | 11.2 | 3.1 | 5.6 |
| G | 25 | 71.7 | 3.3 | 3.6 | 74.1 |

Another coating solution was prepared from a mixture of the 4% BS 11548 dispersion and the 4% aqueous solution of Klucel G, hydroxypropyl cellulose from Aqualon, with a small amount of surfactant (Zonyl FSN). (The melting point of Klucel G is 130° C.) This coating solution was coated with a 2 mil doctor knife onto 5 mil MYLAR polyester film. The resulting Coating F had a composition of 83.8% carbon black, 5% hydroxypropyl cellulose, and 11.2% proprietary material, and the transmission density measured was 2.5.

Another coating solution was prepared from a mixture of Alcotex 552P, a colloidal dispersion in water of a copolymer of vinyl alcohol and vinyl acetate (55/45) (from Harco, having an estimated melting point of 150 to 180° C.) and the carbon black dispersion and coated with a doctor knife onto polyester film to have a dried coating weight of 17 mg/dm$^2$. The resulting Coating H had a composition of 49% carbon black, 44% copolymer of vinyl alcohol and vinyl acetate, and 7% proprietary material (from dispersion), and the transmission density measured was 2.85.

| Coating | Weight % Carbon Black | Weight % Binder | Weight % Other proprietary material | Transmission Density (visual filter) | % binder per total binder + carbon black filler) |
|---|---|---|---|---|---|
| F | 83.8 | 5 | 11.2 | 2.5 | 5.6 |
| H | 49 | 44 | 7 | 2.85 | 47.3 |

All Coatings A-H were each hot laminated to a CYREL photopolymer plate, type UXL, (67 mil), such that the Coating layer was on the photopolymerizable layer of the plate, forming plate samples for Examples 8A, 8B, 8C, 8D, 8E, 8F, and 8H, and Comparative Example 8G. The release layer of the plate had been removed prior to lamination. In all Examples 8A-8F, 8H, and Comparative 8G, the coating layer became a radiation opaque layer. Each plate sample was backflash exposed of 15 seconds on the CYREL 2001 exposure unit. The MYLAR sheet (support for the Coating) was removed from each plate sample. Correct adhesion balance of the coating to the photopolymerizable layer was observed for Examples 8C, 8D, 8E, 8F, and 8H, and Comparative 8G. The Coatings A and B had somewhat higher adhesion to MYLAR (temporary support) such that care was taken while removing the MYLAR so that the coating layer remained on the photopolymerizable layer. All plate samples were given an UV exposure through the radiation opaque (coating) layer for 9 minutes in the open air on Cyrel® 2001 Exposure unit.

All plate samples were thermally processed in the same thermal processor and with the same processing conditions as described in Example 2. A cycle or thermal cycle is the heating of the plate sample and contacting of the surface of the plate with an absorbent material. All radiation opaque coatings gave the desired thermal processing properties and good actinic radiation mask as desired for Examples 8A-8F and 8H.

| Example | Number of Cycles to Remove Radiation Opaque Layer | Relief Depth After 12 Cycles (mils) |
|---|---|---|
| 8A | 2 | 26 |
| 8B | 2 | 30 |
| 8C | 6 | 17 |

-continued

| Example | Number of Cycles to Remove Radiation Opaque Layer | Relief Depth After 12 Cycles (mils) |
|---|---|---|
| 8D | 4 | 25 |
| 8E | 2 | 24 |
| 8F | 2 | 19 |
| 8H | 1 | 23 |
| Comp. 8G | >12 | 0.3 |

However, for the plate of Comparative Example 8G greater than 12 cycles of heating and contacting was required to remove the radiation opaque layer from the element. Also even though the transmission density of the coating layer was sufficiently high (3.6) and thus provided good blocking to the UV radiation, the plate had low relief depth. The coating layer of Comparative Example 8G was not thermally removable and prevented the removal of the underlying unexposed photopolymerizable material. The coating G had greater than 49% binder (based on the total of binder and filler), and thus was not a discontinuous layer.

Further comparatively, the continuous coating layer of Elvanol 50-42 (88% hydrolyzed polyvinyl alcohol) on the photopolymerizable layer could not be thermally processed even in the unexposed area (no relief depth) as described above in Example 3 (Comparative Example 3B). The continuous coating layer of Klucel G (hydroxypropyl cellulose) on the photopolymerizable layer could not be thermally removed in the UV exposed area due to string formation after 12 cycles of heating and contacting absorbent material as described in Example 3 (Comparative Example 3C).

Example 9

The following example demonstrates the element and process of this invention in which the thermally removable layer is a radiation opaque layer that is on the photopolymerizable layer.

Example 8 was repeated except that the coating solutions were made from different materials. A binder solution of copolymer of vinylpyrrolidone and vinyl acetate in a 60/40 ratio (PVP-VA-630 from International Specialty Products) was dissolved as a 4% aqueous solution with small amount of surfactant (Zonyl FSN) added. The binder solution was mixed with the 4% BS 11548 carbon black dispersion of Example 8, such that the dried composition was 49% carbon black, 44% binder and 7% of proprietary material (47.3 wt % binder based on total of binder and carbon black filler), and coated on MYLAR polyester film. The coating had a dry transmission density of 2.5. The coating was then laminated to the photopolymerizable layer of a photopolymer plate (type UXL) as described in Example 8. The plate samples were backflashed, the MYLAR film removed, and then UV exposed through the black layer as described in Example 8.

The plate samples were thermally processed in the same thermal processor and under the same conditions as described in Example 2. For the plate samples, only one thermal cycle was needed to remove the radiation opaque layer together with the underneath polymer layer. The relief depths were 23–26 mils after 12 cycles of heating and contacting absorbent material. Each plate sample met the desired properties as the digital plate capable of being thermally processed.

Example 10

The following example demonstrates the process of this invention in which the thermally removable layer is an actinic radiation opaque mask that can be delivered by conventional ink jet methods or as a physical mask screen onto the photopolymerizable layer.

This inkjet-mask concept was simulated by writing images on the surface of a CYREL photopolymer plate, type UXL, with and without the presence of the release layer on the photopolymer layer, using a black Sharpie permanent Marker (multiple writing to achieve desired density) as the actinic radiation mask. The resulting plates were UV imaged through the ink mask side in the presence of atmospheric oxygen for 9 minutes on a CYREL 2001 exposure unit, backflashed for 15 seconds on the exposure unit, and then thermally processed using the thermal processor and processing conditions as in Example 1. The masks of black ink were thermally removed after first thermal cycle and gave good processed image and relief as desired.

The physical mask was simulated by attaching black vinyl letters (with pressure sensitive adhesive)(from Visu-Com Inc.) on the surface of a CYREL photopolymer plate, type UXL (67 mil), with and without the presence of the release layer on the photopolymer layer, prior to main UV exposure. Exposure to UV radiation through the physical masks (letters) in open air and backflash exposure was carried out as described above for the inkjet mask. After removing the physical mask letters, the plate was processed thermally to give excellent letter images with good relief after 12 cycles of heating and contacting absorbent material as desired.

It is expected that other methods of forming the actinic radiation mask on the photopolymerizable layer would provide just as good of results as above using the thermal process. Mask images could be done by laser ablation transfer mechanism through another donor mask film, or laminating a mask images on a temporary support and then discarding the temporary support.

Example 11

The following example demonstrates the process of this invention for digital mask exposures in which the photosensitive element includes one or more layers with the thermally removable layer and the photopolymerizable layer.

The following general procedure was conducted after the product structures as described below were assembled. The plate was backflashed for 20 seconds on a Kelliegh exposure unit. The temporary coversheet discared and the plate was placed on a CYREL Digital Imager so that the radiation opaque layer (black coating) was facing the laser. The plate was imagewise exposed to laser radiation that ablated the radiation opaque layer from the plate. The image file at the laser energy level as described in Example 1 was used for the imagewise laser exposure. The plate was UV exposed in the Kelliegh exposure unit for 10 minutes in the presence of atmospheric oxygen. The plate was thermally processed in the same thermal 1000TD processor with the same processing conditions as described in Example 2. Post exposure and light finishing were carried out before printing the plate on the Mark Andy press as described in Example 1.

For Example 11A, a plate structure was assembled as follows. A CYREL photopolymer plate, type HOS (67 mils) and a LaserMask® digital imaging film (from Rexam) having a radiation opaque (black) layer of an optical density of 2.8 were laminated together. The plate structure was a temporary MYLAR coversheet, LaserMask™ opaque layer, a release layer of Macromelt 6900 polyamide (coating weight of 24 mg/dm$^2$), and the HOS photopolymerizable layer on permanent support. The photopolymerizable layer included a binder, at least one monomer and a photoinitiator. The ablated solid has a density of 0.06 after being laser ablated at energy of 1.6 Joules/cm$^2$. Thermal processing showed that only one thermal cycle was required to remove the opaque layer and the release layer with the underlying photopolymer layer, and the relief depth after 12 cycles of heating and contacting absorbent was 23 mils. Excellent print quality was also obtained on Mark Andy press for the postexposed and finished plate.

For Example 11B, a plate structure was assembled as follows. A CYREL photopolymer plate, type AQS, (67 mils) having the release layer removed was used as the photopolymerizable layer. A second element having multiple layers including a radiation opaque layer was laminated to the photopolymerizable layer of the AQS plate. The second element was prepared and included in the following order an adhesion modifying layer of 90 parts Macromelt 6900 polyamide and 10 parts copolymer of vinylpyrrolidone and vinyl acetate (60/40 ratio) (PVP-VA-630) having a coating weight of 3.0 mg/dm$^2$; a radiation opaque layer of 16.9 grams of BS-11548 carbon black pigmented dispersion (from CDI Dispersions) (see Ex. 8) and 2.80 grams of Polyox WSRN polyethylene oxide, the layer having a density of 3.0; and an overcoat layer of 100% solution of Polyox WSRN polyethylene oxide having a coating weight of 40 mg/dm$^2$, on a temporary MYLAR polyester support. The plate structure was the temporary MYLAR support as a coversheet, the adhesion modifying layer, the radiation opaque layer, the overcoat layer as a barrier layer, and the AQS photopolymerizable layer on a permanent support. The ablated solid areas of the plate had a density of 0.05 using 3.2 J/cm$^2$ laser energy. Only one thermal cycle was required to remove the radiation opaque layer and the relief depth was 32 mils after 12 cycles of heating and contacting with the absorbent material.

For Example 11C, a plate structure was assembled as follows. A CYREL photopolymer plate, type UXL (67 mils), and a second element having a radiation opaque layer were laminated together. The second element was prepared and included the radiation opaque layer of 33% carbon black and 67% Kraton 1102 an elastomeric poly(styrene-butadiene-styrene) block copolymer having a density of 2.60, and a barrier layer of 100% polyamide having a coating weight of 42 mg/dm$^2$, on a temporary MYLAR support with silicon treated surface. The plate structure was the temporary MYLAR support as a coversheet with the silicon treated surface adjacent the radiation opaque layer, the barrier layer, and the UXL photopolymerizable layer on a permanent support. The ablated solid area on the plate had a density of 0.12 with laser ablation energy of 3.2 J/cm$^2$. Four thermal cycles were required to remove the exposed radiation opaque layer completely with the underneath photopolymerizable layer. The relief depth of 22 mils was obtained after 12 cycles of heating and contacting with the absorbent material. Good printed images were obtained.

Example 12

The following example demonstrates the process of this invention with excellent thermal processing latitude.

Three CYREL photopolymer plates, type DPH, (45 mil) were backflashed for 75 seconds on Kelleigh exposure unit. The DPH plate has the following structure: a permanent blue support; the DPH photopolymerizable layer comprising an elastomeric binder, at least one monomer, and a photoinitiator; a radiation opaque layer of 33% carbon black and 67% Macromelt polyamide, and a coversheet. After discarding the coversheet, the plate was placed on the drum of the CYREL Digital Imager and laser ablated at 3.2 J/cm$^2$ to form in situ mask images as described in Example 1. The plates were exposed to UV radiation through the in situ mask for 14 minutes in the presence of atmospheric oxygen.

The plates were thermally treated in the same thermal processor as described in Example 1. One plate (A) was processed for 12 cycles with blower on, another plate (B) was processed for 12 cycles with blower off, and the third one (C) was processed for 6 cycles with blower off. All plates were light finished and post-exposed for 10 minutes simultaneously. The relief depth and reverse depth for a 30 mil negative line of the processed plates were measured, and the plates were printed. The base (i.e., the permanent support) temperature of the plate as it was treated in the thermal processor was also measured. The results were as follows:

| Plate | Number of Cycles | Relief Depth (mil) | Reverse Depth (micron) | Base Temp. ° C. | Printing |
|---|---|---|---|---|---|
| A | 12 | 24 | 265 | 77 | Excellent |
| B | 12 | 24 | 255 | 82 | Excellent |
| C | 6 | 17 | 268 | 77 | Excellent |

The excellent processing latitude of digitally exposed, but thermally processed plates has been demonstrated. This Example also showed that the number of thermal cycles could be reduced significantly (from 12 down to 6 cycles) and still providing excellent print quality in holding all tonal ranges and fine reverses, and good clean solid printing. Reduced number of cycles will provide a faster turnaround time for the plate.

Example 13

The following example demonstrates the process of this invention in which particle size and volume distribution of particulate material forming a substantially transparent layer on a photosensitive element, influences the thermal processing performance of the element.

A photopolymerizable layer was from a CYREL photopolymer printing plate, type UXL, 67 mils thick, in which a coversheet and a release layer were removed prior to toning. Particulate material was toned on the tacky UXL photopolymer surface by following the same procedures as in Example 3. The photosensitive element comprised support, the UXL photopolymerizable layer, and a layer of particulate material.

The particulate materials that were toned were two types of aluminum silicate powder (Satin White and Sparker, both from Englehard). Satin White has a reported particle size range of 4 to 35 microns and Sparker has a reported particle size range of 10 to 110 microns by the light scattering method according to Englehard. Particle size analysis according to our lab testing on the Coulter® Multisizer as in Example 6, showed particulate size and volume distribution as follows, in microns.

|  | d10 | d50 | d90 |
|---|---|---|---|
| Satin White | 3.16 | 6.73 | 13.67 |
| Sparker | 11.65 | 30.26 | 47.7 |

The excess particulate was removed from the photopolymer surface, and the toned density was measured as a transmission density using a visual filter. Both toned surfaces were tack-free indicating particulate adhering to the plate surface as desired. Example 13A was the element formed of UXL photopolymerizable layer toned with Satin White particulate. Example 13B was the element formed of UXL photopolymerizable layer toned with Sparker particulate. The visual density was 0.39 for Example 13A and 0.14 for Example 13B. The higher visual density of Example 13A relative to Example 13B showed that higher packing system was achieved with the Satin white powder vs. Sparker powder on toned plate surface.

Half of of each sample element was given an UV exposure in the presence of atmospheric oxygen and the other half was not UV exposed. Samples were processed thermally as in Example 3.

It was surprising to find that the toned particulate layer of Example 13A was removed in the first thermal cycle in both exposed and the non-exposed areas. For Example 13A, the relief depth was 20 mils after 12 cycles in the non-exposed areas with no residual particulate on the floor. Also, the UV exposed plate surface was tacky and with no sign of residual particulate. In comparison, for Example 13B, there was still particulate on the floor surface even after 12 thermal cycles with 22 mil relief depth in the non-exposed areas, and the UV exposed plate surface was tack-free due to the presence of particulates on the surface.

Both samples were post exposed and light finished and were printed on Mark Andy press as in Example 1. Example 13A gave good solid printing while Example 13B gave poor solid printing (much lower solid density). Residual aluminum silicate particles on the thermally processed plate surface and floor were not desirable. Residual particles on the floor indicated hard-to-remove nature of Sparker (higher d50 and d90 in micron) and this problem could be worsen for images with high screen ruling images and with fine reverses to cause poor thermal cleaning of plate, thus poor print quality.

The above results showed that particle size and distribution have important impact on the particle packing relationship, and optical effect, thus final thermally processed plate performance. The particle size and volume distribution of Satin White provides the preferred range for thermally processed plate.

Example 14

The following example demonstrates the process of this invention using a photosensitive element having a radiation opaque layer that includes a binder with a softening point less than 190° C.

A CYREL photopolymer plate, type UXL, (67 mils) was used as the photopolymerizable layer. The release layer was removed. A second element was prepared with a radiation opaque layer of 17% carbon black and 83% Macromelt polyamide (melting point 135° C.), having a dried coating weight of 47 mg/dm$^2$ and a transmission density of 2.50. The radiation opaque layer was laminated to the UXL photopolymerizable layer, forming sample element for Example 14.

The radiation opaque layer was imagewise ablated from the photopolymerizable layer forming a mask with infrared laser radiation having energy of 5.9 Joules/cm$^2$. The ablated solid density was 0.19. The element was given a backflash exposure for 20 seconds, and a main UV exposure through the mask for 10 minutes, both on the Kelleigh exposure unit. The element was thermally processed as described in Example 2. Only one cycle (of heating and contacting the element) was required to remove the remaining portions of the radiation opaque layer. The relief depth after 12 cycles was 26 mils. The element was prepared for printing as described above, and had good print results.

What is claimed is:

1. A process for making a flexographic printing plate comprising:
   1) providing a photosensitive element comprising: at least one photopolymerizable layer on a support comprising an elastomeric binder, at least one monomer, and a photoinitiator, and at least one thermally removable layer disposed above the photopolymerizable layer, the thermally removable layer selected from the group consisting of
      (a) an actinic radiation opaque layer comprising (i) at least one infrared absorbing material, (ii) a radiation opaque material, wherein (i) and (ii) can be the same or different, and at least one binder having a softening or melting temperature less than 190° C.;
      (b) a layer of a composition comprising at least one binder and filler, wherein the binder is less than 49% by weight based on the total weight of the binder and filler, and
      (c) a layer of particulate material having particle size of less than 23 micrometers;
   2) imagewise exposing the photopolymerizable layer to actinic radiation forming polymerized portions and unpolymerized portions; and
   3) thermally treating the element of step 2) by heating to a temperature sufficient to remove the thermally removable layer and to remove the unpolymerized portions of the photopolymerizable layer and form a relief.

2. The process of claim 1 wherein the thermally removable layer selected from b) and c) is a release layer.

3. The process of claim 1 wherein the thermally removable layer selected from b) and c) is an actinic radiation opaque layer.

4. The process of claim 3 wherein the thermally removable layer b) further comprises (i) at least one infrared absorbing material, (ii) a radiation opaque material, wherein (i) and (ii) can be the same or different.

5. The process of claim 3 wherein the thermally removable layer c) is radiation opaque and the particulate material can be a radiation opaque material, both a radiation opaque and infrared absorbing material, or combinations thereof.

6. The process of claim 1 wherein the thermally removable layer completely covers the photopolymerizable layer.

7. The process of claim 3 wherein the thermally removable layer is a mask layer having radiation opaque areas, further comprising the step of forming the mask layer imagewise from the thermally removable layer selected from a), b), or c), prior to step 2).

8. The process of claim 7 wherein forming the mask comprises applying the thermally removable layer imagewise to the photopolymerizable layer.

9. The process of claim 7 wherein forming the mask comprises applying as a complete covering layer the thermally removable layer to the photopolymerizable layer, and imagewise removing the thermally removable layer.

10. The process of claim 7 wherein forming the mask comprises forming a carrier element having the thermally removable layer as the imagewise mask on a temporary support, laminating the carrier element to the photopolymerizable layer such that the thermally removable layer is disposed above a surface of the photopolymerizable layer opposite the support, and removing the temporary support.

11. The process of claim 7 wherein forming the mask comprises delivering imagewise the thermally removable layer by ink jet methods.

12. The process of claim 7 wherein the thermally removable layer is also sensitive to infrared radiation and forming the mask comprises:
    forming a carrier element having the thermally removable layer on a substrate;
    placing the carrier element onto the photopolymerizable layer such that the thermally removable layer is disposed above a surface of the photopolymerizable layer opposite the support;
    imagewise exposing with infrared radiation the thermally removable layer to selectively change the adhesion balance of the thermally removable layer to substrate of the carrier element; and
    removing the substrate with portions of the thermally removable layer.

13. The process of claim 7 wherein the thermally removable layer is also sensitive to infrared radiation and forming the mask comprises:
    placing a first element comprising at least the thermally removable layer on a substrate so that the thermally removable layer is in contact with or disposed above a surface of the photopolymerizable layer opposite the support;
    imagewise exposing with infrared laser radiation the thermally removable layer to selectively transfer portions of the thermally removable layer to the photopolymerizable layer; and
    separating the first element with portions of the thermally removable layer.

14. The process of claim 7 wherein the thermally removable layer is also sensitive to infrared radiation and forming the mask comprises:
    imagewise exposing with infrared laser radiation the thermally removable layer to selectively ablate portions of the thermally removable layer from the photopolymerizable layer.

15. The process of claims 12, 13, and 14 wherein the infrared laser radiation is between 760 to 1064 nm.

16. The process of claims 12, 13, and 14 further comprising impinging the infrared laser radiation on the thermally removable layer or through the support side of the photosensitive element.

17. The process of claim 16 wherein the infrared laser radiation impinges the support side of the photosensitive element and further comprising locating a material capture element adjacent to the photosensitive element on a side opposite the support side to capture ablated portions of the thermally removable layer.

18. The process of claim 3 wherein the imagewise exposing step 2) occurs in the presence of atmospheric oxygen.

19. The process of claim 3 wherein the photosensitive element further comprises an additional layer between the thermally removable layer and the photopolymerizable layer, the additional layer being thermally removable at the treating temperature, and composed of materials selected from the group consisting of: polyamide, polyethylene oxide, polypropylene oxide, polyethylene wax, natural waxes, synthetic waxes, polypropylene, polyethylene, copolymers of styrene and acrylic polymers, copolymers of vinylpyrrolidone and vinyl acetate, copolymers of vinyl alcohol and vinyl acetate, polyacetate, copolymers of ethylene and acetate, and combinations thereof.

20. The process of claim 1 wherein the photosensitive element further comprises a adhesion-modifying layer on the thermally removable layer, the adhesion-modifying layer being thermally removable at the treating temperature, and composed of materials selected from the group consisting of: polyamide, natural waxes, synthetic waxes, polyprpylene, polyethylene, copolymers of polyvinylpyrrolidone and vinyl acetate, amphoteric interpolymers, and combinations thereof.

21. The process of claim 1 wherein the photosensitive element further comprises at least one more additional layer selected from the group consisting of:
release layer, adhesion-modifying layer, barrier layer, and surface modifying layer, wherein the at least one more additional layer is transparent to actinic radiation.

22. The process of claim 1 wherein the binder of the thermally removable layer (a) is selected from the group consisting of: polyamides, polyethylene oxide, polypropylene oxide, ethylcellulose, hydroxyethyl cellulose, cellulose acetate butyrate, ethylene-propylene-diene terpolymers, copolymers of ethylene and vinyl acetate, copolymers of vinyl acetate and vinyl alcohol, copolymers of vinyl acetate and pyrrolidone, polyvinyl acetate, polyethylene wax, polyacetal, polybutyral, polyalkylene, polycarbonates, polyester elastomers, cyclic rubber, copolymers of styrene and maleic anhydride, copolymers of styrene and maleic anydride partially esterified with alcohols, and combinations thereof.

23. The process of claim 1 wherein the binder of the thermally removable layer (b) is selected from the group consisting of: polyamides, polyethylene oxide, polypropylene oxide, ethylcellulose, hydroxyethyl cellulose, cellulose acetate butyrate, ethylene-propylene-diene terpolymers, copolymers of ethylene and vinyl acetate, copolymers of vinyl acetate and vinyl alcohol, copolymers of vinyl acetate and pyrrolidone, polyvinyl acetate, polyethylene wax, polyacetal, polybutyral, polyalkylene, polycarbonates, polyester elastomer, copolymers of vinyl chloride and vinyl acetate, copolymers of styrene and butadiene, copolymers of styrene and isoprene, thermoplastic block copolymers of styrene and butadiene, thermoplastic block copolymers of styrene and isoprene, polyisobutylene, polybutadiene, polycholorprene, butyl rubber, nitrile rubber, thermoplastic polyurethane elastomer, cyclic rubbers, copolymers of vinylacetate and (acrylate or methacrylate), acrylonitrile-butadiene-styrene terpolymer, methacrylate-butadiene-styrene terpolymer, alkyl methacrylate polymer or copolymer, copolymers of styrene and maleic anhydride, copolymers of styrene and maleic anhydride partially esterified with alcohols, polyvinyl alcohol, poly(meth)acrylic acids, metal alkali salts of poly(meth)acrylic acids, amphoteric interpolymers, hydroxyalkyl cellulose, cellulose acetate, nitrocellulose, polyimides, polyesters, polyphenylene ethers, polyacrylonitril, polystyrene, copolymers of styrene and methacrylic acid, polyvinyl chloride, polyesters, polyacrylamide, copolymers of imides and amides, polychlorotrifluoroethylene, ethylene and chlorotrifluroethylene copolymer, polytetra fluoroethylene, copolymers of ethylene and tetrafluroethylene copolymer, polyether ether ketone, polybenzimidazoles, copolymers of vinylidene fluoride and hexafluoropropylene, and combinations thereof.

24. The process of claim 1 wherein the filler is selected from the group consisting of: mineral fillers, metallic fillers, metallic alloys, flame retardants, carbon black, graphite, pigments, and combinations thereof.

25. The process of claim 24 wherein the filler has a particle size of less than 23 micrometers.

26. The process of claim 1 wherein the particulate material is selected from the group consisting of: metals, metal alloys, carbon black, graphite, organic particles, inorganic particles, pigment particles, toner particles, mixtures of pigment particles, mixtures of toner particles, and mixtures of pigment and toner particles, and combinations thereof.

27. The process of claim 1 wherein the at least one infrared absorbing material (i), the radiation opaque material (ii), the filler, and the particulate material in the thermally removable layer do not melt at the treating temperature.

28. The process of claim 1 wherein the total amount of the at least one infrared absorbing material (i) and the radiation opaque material (ii) in the thermally removable layer (a) is less than 49% by weight, based on the total weight of (i), (ii) and the binder of (a).

29. The process of claim 1 wherein the thermally removable layer (b) is capable of microcracking to allow unexposed portions of the photopolymerizable layer to melt, soften, or flow at the treating temperature.

30. The process of claim 1 wherein the thermally removable layer is (a).

31. The process of claim 1 wherein the thermally removable layer is (b).

32. The process of claim 1 wherein the thermally removable layer is (c).

33. The process of claim 1 wherein the binder of the thermally removable layers (a) and (b) has a softening or melting temperature between 100° C. and 190° C.

34. The process of claim 33 wherein the binder of the thermally removable layer (b) has a softening or melting temperature greater than 190° C.

35. The process of claim 1 wherein the binder of the thermally removable layer (a) is greater than 51% by weight, based on the total weight of (i), (ii) and the binder.

36. The process of claim 1 further comprising contacting the photosensitive element of step 2) with an absorbent material during the treating step 3).

37. The process of claim 36 further comprising applying pressure of 0.70 kilograms per square centimeter to about 7.03 kilograms per square centimeter during contacting the element and the absorbant material.

38. The process of claim 36 further comprising applying pressure of 2.11 kilograms per square centimeter and about 4.92 kilograms per square centimeter during contacting the element and the absorbant material.

39. The process of claim 1 wherein the thermal treating is heating the photosensitive element above about 40° C.

40. The process of claim 39 wherein the thermal treating is heating the photosensitive element to between 100 and 200° C.

41. The process of claim 36 wherein the heating of the photosensitive element and the contacting of the element with the absorbant material defines a cycle, and wherein the treating step comprises more than one cycle.

42. The process of claim 41 wherein for each cycle the treating temperature and the pressure independently can be the same or different.

43. The process of claim 2 wherein imagewise exposing further comprises:
placing a phototool imaged film on the thermally removable layer, exposing through the phototool with actinic radiation to selectively image the photopolymerizable layer, and removing the phototool prior to the step 3).

44. The process of claim 2 wherein imagewise exposing further comprises:

placing at least one template having radiation opaque portion on the thermally removable layer, exposing through the template with actinic radiation to selectively image the photopolymerizable layer, and removing the at least one template prior to step 3).

45. The process of claim 3 further comprising ablating the actinic radiation opaque layer from the photopolymerizable layer, to form an in situ mask on the photopolymerizable layer prior to the imagewise exposing step 2).

46. The process of claim 1 wherein at least 90 percent of the particulate (c) have the particle size of an equivalent spherical diameter of less than 23 micrometers.

47. The process of claim 1 wherein at least 50 percent of the particulate (c) have the particle size of an equivalent spherical diameter of less than 17 micrometers.

48. The process of claim 1 wherein the thermally removable layer is present prior to the imagewise exposing step 2).

49. The process of claim 3 wherein the thermally removable layer is radiation opaque and is present during the imagewise exposing step.

50. The process of claim 1 wherein the at least one thermally removable layer is less than 50 microns thick.

51. A photosensitive element for use as a flexographic printing plate comprising:

at least one photopolymerizable layer on a support comprising an elastomeric binder, at least one monomer and a photoinitiator, wherein the photopolymerizable layer in an unexposed state is capable of melting, softening, or flowing at a treating temperature of at least 40° C., and at least one thermally removable layer disposed above the photopolymerizable layer, wherein the thermally removable layer comprises at least one binder and a filler, wherein the binder is less than 49% by weight based on the total weight of the binder and filler.

52. The photosensitive element of claim 51 wherein the thermally removable layer has a thickness less than 50 microns.

53. The photosensitive element of claim 51 wherein the thermally removable is an actinic radiation opaque layer.

54. The photosensitive element of claim 51 wherein the binder of the thermally removable layer is selected from the group consisting of: polyamides, polyethylene oxide, polypropylene oxide, ethylcellulose, hydroxyethyl cellulose, cellulose acetate butyrate, ethylene-propylene-diene terpolymers, copolymers of ethylene and vinyl acetate, copolymers of vinyl acetate and vinyl alcohol, copolymers of vinyl acetate and pyrrolidone, polyvinyl acetate, polyethylene wax, polyacetal, polybutyral, polyalkylene, polycarbonates, polyester elastomer, copolymers of vinyl chloride and vinyl acetate, copolymers of styrene and butadiene, copolymers of styrene and isoprene, thermoplastic block copolymers of styrene and butadiene, thermoplastic block copolymers of styrene and isoprene, polyisobutylene, polybutadiene, polycholorprene, butyl rubber, nitrile rubber, thermoplastic polyurethane elastomer, cyclic rubbers, copolymers of vinylacetate and (acrylate or methacrylate), acrylonitrile-butadiene-styrene terpolymer, methacrylate-butadiene-styrene terpolymer, alkyl methacrylate polymer or copolymer, copolymers of styrene and maleic anhydride, copolymers of styrene and maleic anhydride partially esterified with alcohols, polyvinyl alcohol, poly(meth)acrylic acids, metal alkali salts of poly(meth) acrylic acids, amphoteric interpolymers, hydroxyalkyl cellulose, cellulose acetate, nitrocellulose, polyimides, polyesters, polyphenylene ethers, polyacrylonitril, polystyrene, copolymers of styrene and methacrylic acid, polyvinyl chloride, polyesters, polyacrylamide, copolymers of imides and amides, polychlorotrifluoroethylene, ethylene and chlorotrifluroethylene copolymer, polytetra fluoroethylene, copolymers of ethylene and tetrafluroethylene copolymer, polyether ether ketone, polybenzimidazoles, copolymers of vinylidene fluoride and hexafluoropropylene, and combinations thereof.

* * * * *

UNITED STATES PATENT AND TRADEMARK OFFICE
CERTIFICATE OF CORRECTION

PATENT NO. : 6,773,859 B2
DATED : August 10, 2004
INVENTOR(S) : Fan Roxy et al.

It is certified that error appears in the above-identified patent and that said Letters Patent is hereby corrected as shown below:

Column 45,
Line 13, "polyprpylene" should read -- polypropylene --

Signed and Sealed this

First Day of March, 2005

JON W. DUDAS
*Director of the United States Patent and Trademark Office*

UNITED STATES PATENT AND TRADEMARK OFFICE
CERTIFICATE OF CORRECTION

PATENT NO. : 6,773,859 B2
DATED : August 10, 2004
INVENTOR(S) : Fan et al.

It is certified that error appears in the above-identified patent and that said Letters Patent is hereby corrected as shown below:

<u>Title page,</u>
Insert Item -- [60]     Related U.S. Application Data
            Provisional application No. 60/273,669, filed on March 6, 2001 --

Signed and Sealed this

Twenty-sixth Day of July, 2005

JON W. DUDAS
*Director of the United States Patent and Trademark Office*